US011325368B2

(12) United States Patent
Telser et al.

(10) Patent No.: US 11,325,368 B2
(45) Date of Patent: May 10, 2022

(54) METHOD FOR PRODUCING PICTORIAL RELIEF STRUCTURES

(71) Applicant: Flint Group Germany GmbH, Stuttgart (DE)

(72) Inventors: Thomas Telser, Heidelberg-Wieblingen (DE); Matthias Beyer, Weinheim (DE); Daniel Fleischer, Rheinau (DE); Claudia May, Kehl (DE)

(73) Assignee: Flint Group Germany GmbH, Stuttgard (DE)

( * ) Notice: Subject to any disclaimer, the term of this patent is extended or adjusted under 35 U.S.C. 154(b) by 103 days.

(21) Appl. No.: 16/498,039

(22) PCT Filed: Mar. 27, 2017

(86) PCT No.: PCT/EP2017/057209
§ 371 (c)(1),
(2) Date: Sep. 26, 2019

(87) PCT Pub. No.: WO2018/177500
PCT Pub. Date: Oct. 4, 2018

(65) Prior Publication Data
US 2020/0055303 A1 Feb. 20, 2020

(51) Int. Cl.
*B41C 1/00* (2006.01)
*G03F 7/033* (2006.01)
(Continued)

(52) U.S. Cl.
CPC ............... *B41C 1/003* (2013.01); *B41C 1/05* (2013.01); *C09D 11/101* (2013.01); *G03F 7/033* (2013.01); *G03F 7/2032* (2013.01); *G03F 7/36* (2013.01)

(58) Field of Classification Search
None
See application file for complete search history.

(56) References Cited

U.S. PATENT DOCUMENTS 3,495,987 A 2/1970 Moore
3,558,322 A 1/1971 Fan
(Continued)

FOREIGN PATENT DOCUMENTS

DE 3045516 A1 7/1982
DE 4022008 A1 1/1991
(Continued)

OTHER PUBLICATIONS

Chatterjee, S., et al., "Photochemistry of Carbocyanine Alkyltriphenylborate Salts: Intra-Ion-Pair Electron Transfer and the Chemistry of Boranyl Radicals", Journal of the American Chemical Society, 1990, vol. 112, No. 17, pp. 6329-6338.
(Continued)

*Primary Examiner* — Joshua D Zimmerman
(74) *Attorney, Agent, or Firm* — Faegre Drinker Biddle & Reath LLP

(57) ABSTRACT

The invention relates to a method for producing pictorial relief structures on a layer construction. The method comprises the provision of a layer construction having a substrate layer. After this, at least one fluid containing at least one first reactive component is applied pictorially to the substrate, wherein the pictorial application takes place in the form of a plurality of droplets with a droplet volume of less than 2 µl, and wherein the droplets are positioned pictorially. After this, there is an at least partial diffusing of the at least one first reactive component into the substrate layer for a predefined exposure time and/or an at least partial diffusing of at least one second reactive component into the pictorially positioned droplets of fluid for a predefined exposure time, wherein the substrate layer comprises the at least one second reactive component. The created relief is then fixed under the influence of heat and/or radiation via a reaction involving the first reactive component and/or the second reactive component.

(Continued)

Further aspects of the invention relate to a pictorial relief structure produced according to the method and to the use of the pictorial relief structure as a printing form, as a microfluidic component, as a microreactor, as a phoretic cell, as a light-controlling element for color representation, as photonic crystals or as flexible parts of items of clothing.

20 Claims, 1 Drawing Sheet

(51) Int. Cl.
  *G03F 7/20* (2006.01)
  *G03F 7/36* (2006.01)
  *B41C 1/05* (2006.01)
  *C09D 11/101* (2014.01)

(56) References Cited

U.S. PATENT DOCUMENTS

| | | | |
|---|---|---|---|
| 3,567,453 | A | 3/1971 | Borden |
| 4,258,121 | A | 3/1981 | Kojima |
| 4,323,636 | A | 4/1982 | Chen |
| 4,343,891 | A | 8/1982 | Aasen et al. |
| 4,387,157 | A | 6/1983 | Bronstert et al. |
| 4,504,573 | A | 3/1985 | Ishikawa et al. |
| 4,713,401 | A | 12/1987 | Riediker et al. |
| 4,743,528 | A | 5/1988 | Farid et al. |
| 4,743,529 | A | 5/1988 | Farid et al. |
| 4,743,530 | A | 5/1988 | Farid et al. |
| 4,743,531 | A | 5/1988 | Farid et al. |
| 4,784,872 | A | 11/1988 | Moeller et al. |
| 4,857,654 | A | 8/1989 | Riediker et al. |
| 4,910,121 | A | 3/1990 | Riediker et al. |
| 4,987,056 | A | 1/1991 | Imahashi et al. |
| 5,026,625 | A | 6/1991 | Riediker et al. |
| 5,061,606 | A | 10/1991 | Telser et al. |
| 5,262,275 | A | 11/1993 | Fan |
| 5,364,702 | A | 11/1994 | Idei et al. |
| 6,020,108 | A | 2/2000 | Goffing et al. |
| 6,106,984 | A * | 8/2000 | Kato .............. B41C 1/1041 430/302 |
| 6,187,380 | B1 | 2/2001 | Hallman et al. |
| 6,245,421 | B1 * | 6/2001 | Aurenty ............ B41C 1/1066 427/152 |
| 6,641,772 | B2 | 11/2003 | Gelbart |
| 8,685,624 | B2 | 4/2014 | Döttinger et al. |
| 9,096,055 | B2 | 8/2015 | Liu et al. |
| 2004/0131778 | A1 | 7/2004 | Verhoest et al. |
| 2008/0053326 | A1 | 3/2008 | Murphy et al. |
| 2010/0225868 | A1 * | 9/2010 | West .............. G02F 1/136286 349/139 |
| 2016/0082718 | A1 | 3/2016 | Schwab et al. |

FOREIGN PATENT DOCUMENTS

| | | |
|---|---|---|
| DE | 102012013532 A1 | 1/2014 |
| DE | 102013224793 A1 | 6/2014 |
| EP | 109772 A2 | 5/1984 |
| EP | 109773 A2 | 5/1984 |
| EP | 332070 A2 | 3/1989 |
| EP | 0334338 A2 | 9/1989 |
| EP | 0504824 A1 | 9/1992 |
| EP | 0641648 A1 | 3/1995 |
| EP | 0741330 A1 | 11/1996 |
| EP | 0767406 A1 | 4/1997 |
| EP | 992849 A1 | 4/2000 |
| EP | 1069475 A1 | 1/2001 |
| EP | 1170121 A1 | 1/2002 |
| EP | 1239329 A2 | 9/2002 |
| EP | 1428666 A1 | 6/2004 |
| EP | 1552922 A1 | 7/2005 |
| EP | 2033778 A1 | 3/2009 |
| EP | 2279454 A1 | 2/2011 |
| GB | 1279999 A | 6/1972 |
| JP | S4537377 B1 | 11/1970 |
| JP | S4642363 B1 | 12/1971 |
| JP | S4809005 B1 | 3/1973 |
| JP | S55118030 A | 9/1980 |
| JP | S59152396 A | 8/1984 |
| JP | S59174831 A | 10/1984 |
| JP | S61151197 A | 7/1986 |
| JP | S6341484 A | 2/1988 |
| JP | S6314340 B2 | 3/1988 |
| JP | S63138345 A | 6/1988 |
| JP | S63142345 A | 6/1988 |
| JP | S63142346 A | 6/1988 |
| JP | S63143537 A | 6/1988 |
| JP | H01152109 A | 6/1989 |
| JP | H1304453 A | 12/1989 |
| JP | H024705 A | 1/1990 |
| JP | H02000249 A | 1/1990 |
| WO | WO-199400383 A1 | 1/1994 |
| WO | WO-9403838 A1 | 2/1994 |
| WO | WO-9403839 A1 | 2/1994 |
| WO | WO-0046035 A1 | 8/2000 |
| WO | WO-2003062900 A1 | 7/2003 |
| WO | WO-2004015491 A1 | 2/2004 |
| WO | WO-2009141256 A1 | 11/2009 |
| WO | WO-2012175525 A1 | 12/2012 |
| WO | WO-2014095361 A1 | 6/2014 |
| WO | WO-2014209428 A1 | 12/2014 |

OTHER PUBLICATIONS

Davidson, R., "The chemistry of photoinitiators—some recent developments", Journal of Photochemistry and Photobiology A: Chemistry, 1993, vol. 73, No. 2, pp. 81-96.
Davidson, R.S., "Exploring the Science", Technology and Applications of U.V. and E.B. Curing, Sita Technology LTD, 1999, pp. 67-118.
Eaton, D., "One-Electron Oxidation of Benzyltrialkylstannanes. 1. Cation Radical Fragmentation by Dual Modes", Journal of the American Chemical Society, 1990, vol. 102, No. 9, pp. 3278-3281.
Fouassier, J.P., "Photoinitiated Polymerisation—Theory and Applications", Rapra Review Reports, 1998, vol. 9/4, No. 100, pp. 3-23.
International Preliminary Report on Patentability for PCT/EP2017/057209 dated Oct. 10, 2019 with PCT/IB/338 (English translations).
Maslak, P., "Fragmentations by Photoinduced Electron Transfer. Fundamentals and Practical Aspects", in Mattay J. (eds) Photoinduced Electron Transfer V. Topics in Current Chemistry, 1993, vol. 168, No. 1, pp. 1-46.
Monroe, B., et al., "Photoinitiators for Free-Radical-Initiated Photoimaging Systems", Chemical Reviews, 1993, vol. 93, No. 1, pp. 435-448.
Saeve, F., "Photoinduced Electron Transfer (PET) Bond Cleavage Reactions", in Mattay J. (eds), Photoinduced Electron Transfer I. Topics in Current Chemistry, 1990, vol. 156, No. 59, pp. 59-92.
Shirai, M., et al., "Photoacid and photobase generators: Chemistry and applications to polymeric materials", Progress in Polymer Science, 1996, vol. 21, No. 1, pp. 1-45.
Valet, A., "Light Stabilizers for Paints", in *The Technology of Coating*, Zorll, U. (ed), Vincentz Verlag, Hannover, Germany, 1996, pp. 33-44, (in German).
Valet, A., "Light Stabilizers for Paints", in *The Technology of Coating*, Zorll, U. (ed), Vincentz Verlag, Hannover, Germany, 1996, pp. 21-32 (in German).
International Search Report for PCT/EP2017/057209 dated Nov. 23, 2017.
Written Opinion of the International Searching Authority for PCT/EP2017/057209 dated Nov. 23, 2017.

* cited by examiner

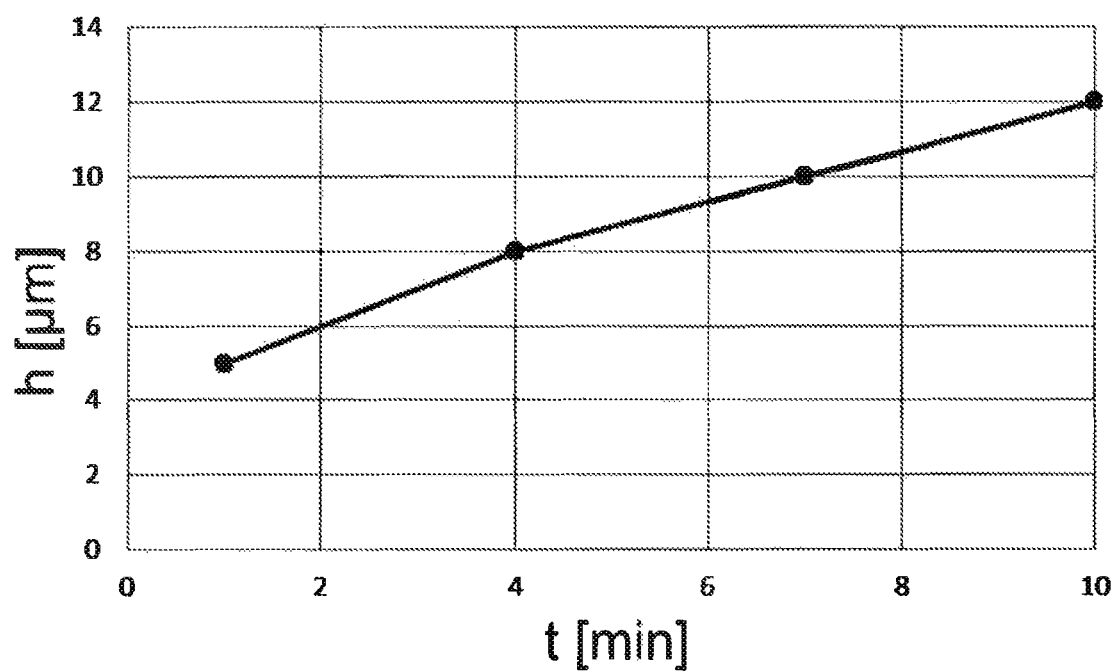

METHOD FOR PRODUCING PICTORIAL RELIEF STRUCTURES

CROSS-REFERENCE TO RELATED APPLICATIONS

This application is a national stage application (under 35 U.S.C. § 371) of PCT/EP2017/057209, filed Mar. 27, 2017, which is incorporated herein by reference in its entirety.

The invention relates to a method for producing information-containing relief structures, for example with pictorial structures that are produced in a selective and structured manner, wherein a layer construction with a substrate layer is provided, a fluid containing a reactive component is applied pictorially to the polymeric substrate layer, and optionally, the excess fluid is then removed from the surface and the created relief is fixed by polymerization and/or crosslinking.

Relief structures, such as e.g. printing forms, are used for example for printing on a wide variety of substrates (paper, films, cardboard etc.) with low-viscosity printing inks. Water- or alcohol-based polar printing inks are usually used as printing inks. Because of the printing process, printing forms are required that are soft, elastic, and resistant to polar printing inks. The relief depth is typically in the range of 50 µm to 4 mm.

Common precursors for relief structures therefore contain an elastic non-polar binder, usually block copolymers based on styrene-isoprene or styrene-butadiene, in combination with monomers, plasticizers and one or a plurality of photoinitiators (see for example U.S. Pat. No. 4,323,636). This radiation-sensitive layer is generally a few mm thick and is located on a dimensionally stable carrier, usually a PET film. The relief is produced by exposure to electromagnetic waves through a mask film. On exposure, the exposed areas undergo crosslinking, while the unexposed areas of the precursor remain soluble or liquefiable and are removed by suitable methods.

Alternatively to film exposure, relief structures can also be exposed through a mask produced by means of a laser. The thin ablatable mask layer is located directly on the radiation-sensitive layer (see for example U.S. Pat. No. 5,262,275). By means of pictorial ablation, a mask is produced, and exposure to electromagnetic waves is then carried out through the mask.

Regardless of whether exposure of the radiation-sensitive layer is carried out through a film or through a laser-produced integral mask, the relief must then be produced by washing out in suitable organic solvents (see for example EP332070).

During washing out of the relief, the crosslinked areas of the relief structure also swell up due to the solvent. This solvent must then be removed in a drying step. Because of the temperature sensitivity of the carrier film, drying of the flexographic printing forms can only be carried out at low temperatures. The necessary drying times are therefore long. Depending on the layer thickness of the relief structure, drying times of 30 minutes to several hours are required.

Many studies have therefore been conducted in order to arrive at relief structures that can be more rapidly developed. For example, printing plates can also be thermally developed (see for example EP1239329 or EP1170121). Here, after pictorial exposure, the relief structures are heated to melting temperature. The unexposed areas of the relief structure thus become partially liquid and sticky and are then continuously removed by means of contact with a nonwoven or woven fabric, because the liquid material adheres thereto.

However, the method involves complex equipment, as multiple layers must be successively pulled off in order to produce a sufficient relief. Moreover, the possible resolution of the relief structures produced in this manner is lower than the resolution of relief structures washed out in solvents.

In principle, therefore, it would be desirable to have a method in which the relief is produced not by a development step, but generatively (i.e. by building up the relief). This would allow the production time of a relief structure to be considerably shortened and simplified. Moreover, considerably less material would be required, and the environmental performance of a printing form produced in this manner would be substantially improved. In particular, one could dispense with the use of polluting solvents, and the waste volume could be sharply reduced. In particular, thermal development produces greater amounts of waste, as both the wash-out solutions and the nonwoven or woven fabric saturated with the formulation are rarely recyclable or very difficult to recycle and are therefore usually incinerated.

For high-quality printing, freestanding elements can be imaged up to a fineness of 100 µm (freestanding relief point) or 30 µm (freestanding line) onto a letterpress printing form. Finer elements can only be imaged onto a letterpress printing form if a reduced relief depth is selected. DE102012013532 describes a method that operates with relief depths of less than 250 µm. The advantage of this method is that the web to be printed is guided in a more favorable manner, and there are no motif-related mechanical vibrations in the printing machine. What is important in this method is that the relief ground must not be colored with printing ink, or it will also print. This is difficult to accomplish under current production conditions. A further difficulty of the method is the precise setting of a low relief depth.

Even finer printing elements of the order of only a few µm are required for special applications such as the printing of strip conductors for touch screen displays. For this purpose, relief structures are required that have low relief depths (<100 µm) but can reliably and reproducibly image fine details of the order of 5 to 50 µm (see for example WO2014/209428).

There is therefore a need for relief structures having a low relief and high resolution, wherein the relief is preferably produced by a generative method.

Various methods are known for building up a relief in layers, i.e. generatively, using inkjet technology (see for example EP0641648, US20040131778, EP2033778, WO2012/175525, WO2014/095361, US2008/0053326). The general principle of these patent documents is to pictorially apply a reactive monomer mixture, for example a monomer/photoinitiator mixture, by means of an inkjet printing process to a suitable substrate, and to immobilize or cure it as quickly as possible by means of irradiation so that the applied droplets cannot spread or flow. The relief is built up by successively applying multiple layers in this manner.

However, there are decisive drawbacks in building up a relief structure by means of an inkjet printing process. Only fluids of low viscosity can be applied via an inkjet printing head. Ordinarily, the intrinsic viscosity is <15 mPa·s. Only relatively small molecules can therefore be used to formulate the reactive monomer mixture. These monomers are not capable of forming an elastomeric, stable material, as the reactive monomers are selected from the class of the acrylic acid or methacrylic acid esters. This either causes the built-up materials to be too hard, or they are sufficiently soft, but are not resistant to polar printing inks and/or exhibit excessive swelling.

US2008/0053326 describes a method in which elastic prepolymers or polymers are applied by means of an inkjet printing process and crosslinked, and a relief material is built up in a layered manner. The materials must be heated so that thin melts are produced that can be applied by means of the inkjet printing process. However, the viscosity remains relatively high, which means that relatively large nozzle openings must be used, which means that the achievable structural sizes are in ranges that are not suitable for high-resolution printed materials. Moreover, there is a considerable risk of clogging of the nozzles due to the cooling melt and thus of accompanying structural defects.

EP1552922 avoids the viscosity problem in that solid particles are dispersed in a carrier fluid, and this dispersion is applied in layers in an inkjet printing method. In this method, however, the carrier fluid must then be removed, which makes the method complex and inexact. Moreover, the particles must be extremely small in order to avoid clogging of the nozzles, and because of sedimentation of the particles, the stability of the dispersions used is poor.

U.S. Pat. No. 6,641,772 describes a stereolithography method by means of which relief structures can be constructed. A temperature-sensitive resin solution or melt is heated at certain points with an IR laser and thermally cured to form three-dimensional structures. The method involves complex equipment, and the resolution is sharply limited, both by the diameter of the laser beam and the unclear temperature profile produced in the melt.

The object to be achieved is to provide an elastic relief structure by means of an additive method that does not have the above-mentioned drawbacks and produces relief structures in precise detail. In particular, the viscosity and stability problems of inkjet methods are to be solved.

It has been surprisingly found that by means of a method based on the repeated pictorial, droplet-form application of low-viscosity reactive fluids to a substrate layer with subsequent diffusion and fixation, relief structures can be produced.

A method for producing pictorial relief structures on a layer construction is proposed. The method comprises the following steps:
  a) provision of a layer construction having a substrate layer,
  b) optionally, partial removal of a mask layer, so that the at least one substrate layer is pictorially exposed,
  c) pictorial application of at least one fluid containing at least one first reactive component to the substrate layer, wherein the pictorial application takes place in the form of a plurality of droplets with a droplet volume of less than 2 µl, and wherein the droplets are positioned pictorially,
  d) at least partial diffusing of the at least one first reactive component into the substrate layer for a predefined exposure time and/or at least partial diffusing of at least one second reactive component into the pictorially positioned droplets of fluid for a predefined exposure time, wherein the substrate layer comprises the at least one second reactive component,
  e) optionally, removal of fluid remaining on the substrate layer,
  f) fixing of the created relief under the influence of heat and/or radiation via a reaction involving the first reactive component and/or the second reactive component, and
  g) optional aftertreatment of the relief.

A BRIEF DESCRIPTION OF THE FIGURE

FIG. 1 illustrates that with increasing exposure time t, the height h of the relief structure produced increases approximately linearly.

In step a), a layer construction comprising at least a substrate layer is provided. The layer construction can be composed only of the substrate layer or may have additional layers. On one side of the substrate layer, there can for example be carrier layers, compression layers, adhesion promoter layers, barrier layers, and protective layers and any desired combinations thereof. On the opposite side, for example, mask layers, adhesion layers, release layers, intermediate layers, barrier layers, mask layers, and protective layers and any desired combinations thereof can be arranged in any desired order.

Dimensionally stable carrier materials, which can optionally carry further layers, can be used as carrier layers. Examples of suitable dimensionally stable carriers are plates, films and conical and cylindrical tubes (sleeves) of metals such as steel, aluminum, copper or nickel or plastics such as polyethylene terephthalate, polybutylene terephthalate, polyamide and polycarbonate, woven and nonwoven fabrics such as glass fiber woven fabrics, and composite materials of glass fibers and plastics. Particularly suitable as dimensionally stable carriers are dimensionally stable carrier films or metal sheets, for example polyethylene or polyester films or steel or aluminum sheets. These carrier films or sheets are generally between 50 µm and 1100 µm, preferably 75 µm to 400 µm, for example approx. 250 µm thick. If steel is used as a carrier material, steel sheets with a thickness of 0.05 µm to 0.3 mm are preferred. Tin-plated steel sheets are preferably used in order to protect against corrosion. These carrier films or carrier sheets can be coated with a thin adhesion-promoting layer, for example a 1 to 5 µm thick layer, on the side of the carrier film facing toward the substrate layer. This adhesive layer can for example be composed of a mixture of a polycarbonate, a phenoxy resin, and a multifunctional isocyanate.

These carrier films or carrier sheets can be equipped in advance with a thin adhesion-promoting layer (primer) or can be provided with such a layer subsequently. Adhesive layers may be located between the carrier layer and the substrate layer. Examples of usable adhesive lacquer layers include polyurethane adhesive lacquers (e.g. according to DE3045516) based on polyisocyanate-crosslinked polyether or polyester lacquers in layer thicknesses of between 0.1 µm and 50 µm, in particular between 2 µm and 30 µm.

Intermediate layers can be located on the side of the adhesive layer facing away from the carrier layer, have layer thicknesses of between 0.1 µm and 50 µm, in particular 1 µm and 10 µm, and can for example be obtained from a diluted aqueous alcohol solution of (e.g. up to 80 mol %) partially saponified polyvinyl esters, phenyl glycerol ether monoacrylate and glyoxal by means of application, drying, and baking. The adhesion between the dimensionally stable carriers and the substrate layer should be greater than 0.5 N/cm, measured in a peel test at a peel-off angle of 90° and a peel-off rate of 30 mm/min.

The substrate layer can also be composed of more than one layer, wherein it generally comprises 2 to 20 layers, preferably 2 to 5 layers, particularly preferably 2 to 3 layers, most particularly preferably 2 layers. The layers may contain the same components or different components, and in the same and/or different proportions. Preferably, these layers contain the same components. Preferably, the substrate layer or substrate layers lying closest to the carrier layer is/are already fixed, crosslinked, and/or reacted off. At least one substrate layer is arranged on these fixed, crosslinked, reacted-off layers, which can also be fixed and/or crosslinked and/or reacted off.

Barrier or protective layers can be used in order to protect the substrate layer from negative environmental influences such as e.g. light, moisture, oxygen, or ozone or combinations thereof. However, it is also possible to combine different barrier properties in one layer, and this layer can also be the carrier layer.

Barrier layers against light can be composed of plastics which themselves absorb or reflect corresponding wavelengths (e.g. polyethylene naphthalate, which absorbs in the UV region) or of plastics containing materials that absorb or reflect the corresponding wavelengths (such as described e.g. in EP0504824A1 DuPont or EP0767406A1 BASF).

Barrier layers against moisture can be composed of polymers that show a low diffusion coefficient for water. Examples are polyethylenes, polypropylenes, polyesters, polyvinyl alcohols, and any desired combinations thereof.

Barrier layers against oxygen can play a major role in the subsequent exposure to electromagnetic waves, as radical reactions are strongly affected and slowed by oxygen. Suggested as materials for non-photopolymerizable barrier layers are both water-soluble binders and binders soluble in organic solvents, specifically polyamides, polyvinyl alcohols, hydroxyalkyl celluloses, ethylene-vinyl acetate copolymers, amphoteric interpolymers, cellulose acetate butyrate, alkyl cellulose, butyral, cyclic rubbers, and combinations thereof. Preferable for use are polyvinyl alcohol, partially saponified and high-saponification polyvinyl carboxylate, poly(ethylene oxide-vinyl alcohol) graft copolymers, or poly(ethylene-vinyl alcohol) copolymers. The thickness of the barrier layer is as a rule 0.25 µm to 76 µm, preferably 0.38 µm to 64 µm.

A protective layer is ordinarily the outermost layer from the carrier layer, serves primarily to protect the substrate layer from mechanical damage (e.g. scratches) and dirt or dust, and is as a rule removed prior to further processing steps within the framework of step a). The protective layer is usually a thin and preferably also dimensionally stable plastic film of polyesters (e.g. polyethylene terephthalate, polybutylene terephthalate), polyamides, polyurethanes or polyethylene. In order to protect the underlying layers from light, the protective layer can also contain light-absorbing materials and thus prevent a premature undesired reaction in the layers and degradation of the materials contained therein.

Adhesion-improving layers or intermediate layers are intended to increase the adhesion between individual layers and stabilize the layer construction. Materials should be selected that can build up an interaction between the two layers. Preferred examples are surfactants, amphiphilic molecules with hydrophobic and hydrophilic areas, block copolymers, and oligomers containing blocks that are compatible with the two layers or with the polymers in the layers.

Release layers are intended to reduce the adhesion between individual layers and for example facilitate peeling off of at least one other layer. These layers can be located at widely differing sites in the layer construction and can be used for simple removal of one or a plurality of layers.

A mask layer can take on very special significance, as it can ensure that the substrate layer can be pictorially treated with fluids and/or irradiated. The mask layer should preferably be ablatable by a laser and should constitute a barrier to the reactive components used in the fluid or the monomer used, i.e. diffusion of the monomer through the mask is to be prevented.

The laser-ablatable mask layer is composed of at least one polymeric binder and at least one light-absorbing component, wherein the second polymeric binder can simultaneously also be the light-absorbing component. The selection of the polymeric binder of the mask layer depends on the respective application of the printing form. If one intends to use the method according to the invention to produce soft elastic, non-polar flexographic printing forms, one will select as a binder for the mask layer a polar binder in order to ensure the barrier action with respect to the non-polar monomer.

If the carrier in the method according to the invention is mounted on a drum laser for ablation purposes, the mask layer must be sufficiently flexible. The mask layer is considered to be sufficiently flexible if it shows no cracks when the carrier is bent onto the drum, and if the mask layer shows no waves, wrinkles, or other surface structures on dismantling of the polymeric carrier.

The mask layer should be capable of favorable ablation. Sharp-edged structures should be produced during the ablation process. In particular, one should not be able to find any melt edges or deposits from the ablation exhaust air around the ablated structures.

Favorably suitable polar binders for the mask layer are for example polyvinyl alcohols, low-, medium-, or high-saponification polyvinyl acetates, polyvinyl acetals such as e.g. polyvinyl butyral, water- or alcohol-soluble polyamides, alcohol-soluble polyurethanes or polyesters, polyacrylic acid, cellulose or cellulose derivatives such as e.g. hydroxypropylcellulose or hydroxyethylcellulose or nitrocellulose, ethylene-vinyl alcohol copolymers, polycyanoacrylates, polyethylene oxide or polyethylene oxide copolymers.

Examples of binders for the mask layer include ethylene vinyl acetates, soft elastic polyamides, soft elastic polyurethanes, nitrocellulose, polyvinyl acetals such as e.g. poly (vinyl butyral-vinyl alcohol) copolymers (Butvar®, Mowital®) or poly(vinyl butyral-vinyl ethyral-vinyl alcohol) copolymers (Pioloform®). Of course, other soft elastic materials can also be used as a binder, such as e.g. partially saponified polyvinyl acetates. A preferred binder for the mask layer is the soft elastic polyamide Makromelt® 6900. Examples of imaging on flexographic printing elements with IR ablative masks are disclosed for example in U.S. Pat. No. 5,262,275, WO1994/00383, EP0741330 or EP1069475.

Particularly well-suited are polyvinyl acetates with an average degree of saponification of between 50 mol % and 90 mol %. Strictly speaking, these binders are copolymers of vinyl acetate and vinyl alcohol units. These binders are sufficiently polar, have a blocking action with respect to non-polar monomers, possess favorable flexibility, and also show favorable ablation capacity. Naturally, mixtures of the above-mentioned binders can also be used.

The laser-ablatable mask layer comprises the binder(s) in an amount of 35 wt. % to 99 wt. % based on all components of the mask layer. Moreover, the mask layer comprises a light-absorbing component. Depending on which laser is to be used for ablation, the mask layer comprises, in addition to the second polymeric binder, UV absorbers or UV-absorbing dyes or pigments (UV laser), VIS dyes or NIR dyes or NIR pigments or IR pigments (VIS, IR laser). Preferably, carbon black, graphite, nano-carbon black particles, or carbon nanotubes are used as a light-absorbing component. Carbon black is advantageous as a light-absorbing component in that no migration takes place from the mask layer into the underlying polymer substrate layer.

Provided that the light-absorbing component is not identical to the polymeric binder of the mask layer, the percentage by weight of the light-absorbing component can be 1 wt. % to 65 wt. %. The amount depends on the layer thickness of the mask layer, which has a thickness of 0.5 µm to at most 10 µm, preferably of 0.5 µm to 5 µm. With layer thicknesses below 0.5 µm, it is difficult to produce a homogeneous, sealed, and blocking layer. With layer thicknesses above 10 µm, the ablation energies required are excessively high, and the ablation times become too long. The light absorption of the mask layer in the range of the wavelengths of the laser used should be >10%. The mask layer can optionally also comprise further components such as plasticizers, crosslinking components, dispersion auxiliaries, flow control agents, adhesive components, or surfactant substances.

Moreover, the mask layer comprises further components such as binders and additives that provide favorable processability, film formation, and development. Ablation by means of lasers has been found to be a good option for imaging. In this process, the mask layer is removed by the high energy input of laser irradiation, and only at the sites where the laser beam strikes the mask layer. In this manner, a negative image of the relief structure to be produced is created in the mask layer. In particular, the use of IR lasers for ablation of the mask layer and exposure with electromagnetic radiation in the UV region have been found to be robust and efficient. Such layers are described for example in WO94/03839, U.S. Pat. No. 5,262,275, WO94/03838 and EP0767406. A mask layer can also simultaneously serve as a barrier layer and inhibit or slow the diffusion of oxygen or other detrimental substances.

If the layer construction provided in step a) comprises a protective layer, this layer is removed before carrying out the following steps b) to g), which is possible both mechanically and chemically by treatment with solvents, water or aqueous solutions. Preferably, the protective layer is peeled off.

In optional step b), if a mask layer is present, this layer is at least partially removed, and the underlying substrate layer is pictorially exposed. Imaging of the mask layer takes place by removal of the layer. Preferably, a mask layer is used that is ablatable by means of high-energy radiation. In ablation with high-energy radiation, steels are guided over the radiation-sensitive layer in a computer-assisted manner, and material is removed in the irradiated area. The wavelength of the incident electromagnetic waves is in the range of 200 nm to 100 µm, preferably in the IR region, particularly preferably in the range of 500 nm to 50 µm, and most particularly preferably in the range of 800 nm to 20 µm. Here, it can be advantageous to use narrow-band or monochromatic wavelength regions such as those that can be produced using lasers or light-emitting diodes (LEDs). In these cases, wavelengths in the ranges of 355 nm, 405 nm, 415 nm, 490 nm, 532 nm, 830 nm, 980 nm, 1064 nm, and 10.6 µm are preferred, individually or in combinations.

Pictorial exposure of the substrate layer is understood to mean that the areas of the substrate layer exposed by the partial removal of the mask layer essentially correspond to the shape of the pictorial relief structures to be produced. Here, essentially means that the openings in the mask layer can be larger or smaller than the relief structures to be produced in order to compensate for shrinking or enlargement of the structures.

In step c) pictorial application of at least one fluid that contains at least one first reactive component is carried out on the surface of the substrate layer. This can be carried out by any methods that allow a fluid to be applied in a targeted manner on specific positions of the surface in the form of droplets, such as e.g. application of droplets by an inkjet method, application by means of a movable nozzle, and any desired combinations thereof. The pictorial application of the fluid can be supported by the presence of an optional mask layer that was partially removed in optional step b). The openings in the mask layer can be used to additionally limit the applied fluid and increase the resolution of the produced structures. In general, only one fluid is applied, but it can also be advantageous to apply two or more different fluids, in order for example to locally influence in different areas the relief height or a physical and/or chemical property of the relief.

Pictorial application of the at least one fluid is understood to mean that the amount and arrangement of the droplets follows the shape of the relief structure to be produced.

In a preferred embodiment, the at least one fluid is applied by means of inkjet methods in which jets or droplets are applied in a targeted manner and pictorially to the substrate layer, either continuously and/or by "drop on demand." All inkjet methods are suitable for application of the fluid, and the known print head designs and droplet production methods can be used. In the continuous inkjet method, the ink jet exits the print head via a nozzle. This jet is modulated by means of a piezoelectric transducer located behind the nozzle so that uniform decomposition into individual droplets (Rayleigh droplet decomposition) is achieved. A charging electrode is used to impart to the droplets thus formed a more or less strong electrostatic charge. The droplets then pass through a larger deflecting electrode, where—depending on their specific electric charge—they are laterally deflected. Depending on the type of device, the charged or uncharged droplets reach the substrate. Unneeded droplets are collected at the print head and recycled into the ink circuit. Moreover, a distinction is made between binary deflecting methods and multi-deflecting methods. In the former method, the droplets either reach the substrate or are diverted into a droplet collector. In the multi-deflecting method, the droplets can be deflected differently due to their different charge states. In this manner, it is possible to print a wider line via a nozzle. The width of the line depends on the distance of the nozzle from the substrate, with a greater distance reducing the resolution. The "drop on demand" method is a preferred embodiment. In this method, only the droplet that is actually needed leaves the nozzle, and it is also placed where it is needed.

Bubble jet print heads produce tiny fluid droplets by means of a heating element that heats the ink fluid. A tiny vapor bubble is formed in an explosive manner, and the pressure of this bubble ejects an ink droplet from the nozzle. Two systems are used. In one system, a bubble jet technique is used in which the nozzles are at right angles to the heating elements (edge shooter). The method is highly similar to the piezo method, but the ejection pressure is produced not by a piezoelectric element, but by a vapor bubble. The individual heating element operates with a frequency of up to 24 kHz. In a second system, flat nozzle elements are used that consist essentially of two plates. The plate facing the substrate comprises a tiny nozzle bore hole, and the vapor bubble forms with respect to this bore hole (side shooter). Print heads that operate by this method are extremely simple to produce and are therefore economical. However, these print heads have the drawback of a limited useful life. The method is used for all exchangeable print heads. In pressure valve printers, individual valves are attached to the nozzles that open when a droplet is to exit the nozzle.

The preferred piezo print heads utilize the piezoelectric effect to eject the fluid through a fine nozzle, wherein ceramic elements undergo deformation under electric voltage. The ink forms droplets the volume of which can be controlled by the magnitude of the electric impulse applied. The working frequency of a piezo crystal goes up to 23 kHz.

The application of the droplets takes place in a flat arrangement in which the surface of the substrate layer is horizontally oriented so that the droplets do not flow away. The entire area of the surface to be structured is divided into smaller areas such that an inkjet head with at least one nozzle can carry out imaging of the area within the shortest exposure time necessary. In some cases, multiple print heads are required for this purpose.

The size of the droplets can vary over a broad range, and is in the range of 0.1 µl (picoliters) to 2 µl, preferably in the range of 0.5 µl to 0.5 µl, particularly preferably in the range of 1 µl to 300 nl (nanoliters), and particularly preferably in the range of 1 µl to 100 nl. In special cases, the droplet size can also be smaller than 100 µl. In building up a relief, it is preferable to begin with relatively large droplets at the outset in order to obtain a wider and higher base, and then to reduce the droplet size in the following layers in order to achieve the required resolution.

The application of the fluid can take place at room temperature or at other temperatures adapted to the corresponding circumstances. In addition to higher temperatures, lower temperatures can also be required, in particular when highly reactive systems with highly reactive components are used. The temperature can vary in the range of −20° C. to 200° C., preferably in the range of 0° C. to 200° C., particularly preferably in the range of 20° C. to 180° C., and most particularly preferably in the range of 20° C. to 150° C. Cooler fluid can be applied to a warmer substrate, warmer fluid to a cooler substrate, or warm fluid to a warm substrate. Preferably, the substrate and fluid are at the same temperature on application, but the temperatures may also be different.

In step d), at least some of the applied fluid at least partially diffuses or migrates into the substrate layer and/or diffusion-capable components of the substrate layer, in particular at least one second reactive component, diffuse or migrate into the droplets. This process can take place over a long period of time. The exposure time can vary between 1 second to 30 minutes, preferably 1 second to 10 minutes, particularly preferably 10 seconds to 10 minutes, and most particularly preferably 1 minute to 5 minutes. In special cases, the diffusion can also take place over several hours. The diffusion can be influenced by adjusting the temperature, wherein the temperature range has a lower limit of the solidification point of the fluid to be applied and an upper limit of the boiling point thereof. The temperature can vary in the range of −20 to 200° C., preferably in the range of 0° C. to 200° C., particularly preferably in the range of 20° C. to 180° C., and most particularly preferably in the range of 20° C. to 150° C.

The diffusion conditions can be adjusted to the special circumstances, and for example can be longer in the use of large droplets than with small droplets. In order to allow larger droplets to diffuse in more rapidly, one can carry out the method at higher temperatures than those used when structures with more precise details are to be produced with smaller droplets. If there is a partial diffusion of components from the substrate layer into the droplets, or if this diffusion direction predominates, the exposure time depends on how rapidly this diffusion proceeds, allowing a state to be reached that leads to stable structures in the subsequent fixation. In the repeated application of droplets, the diffusion time can be of equal length for each step, or in accordance with the circumstances, can be of different lengths. In the repeated application of droplets to approximately the same site or when the droplet areas overlap, it can be advantageous to alter the diffusion time continuously or in stages, with an increasing number of repetitions, and preferably to prolong the diffusion time.

By means of the diffusion of the fluid or components thereof, the volume of the substrate layer in the treated area increases, giving rise to an elevated area, a relief structure. The extension in the plane of the substrate layer surface is influenced by the size of the droplets used for application or the amount of material and/or the size of an opening of the mask layer and the spreading behavior of the fluid on the surface. As a rule, the extension is greater than or equal to one applied droplet or an opening of the mask layer. The extension is in the range of 10 µm$^2$ to 50 mm$^2$, preferably in the range of 10 µm$^2$ to 20 mm, particularly preferably in the range of 20 µm$^2$ to 10 mm$^2$, and most particularly preferably in the range of 50 µm$^2$ to 10 mm$^2$. The height of the relief structure that can be achieved after a single application of a fluid is in the range of 0.01 µm to 50 µm, preferably in the range of 0.1 µm to 20 µm, particularly preferably in the range of 1 µm to 10 µm, and most particularly preferably in the range of 5 µm to 10 µm. After multiple applications of fluid, the relief height is in the range of 0.05 µm to 1000 µm, preferably in the range of 1 µm to 500 µm, particularly preferably in the range of 1 µm to 200 µm, and most particularly preferably in the range of 1 µm to 10 µm.

The individual droplets can be placed such that they overlap and flow into one another, i.e. form a closed surface, or separated, so that individual mounds are formed. In the following layers, the droplets, can be placed in the resulting depressions, and a compact structure can be produced. In the case of mounds, these can be directly applied atop one another so as to form depressions or networks that are perpendicular or slanted in relation to the substrate surface whose cavities contribute to elasticity and/or can take up other materials. Any desired combinations of the above-mentioned applications are also possible. In an embodiment, the exposure time is to be selected such that the fluid is largely diffused in and preferably entirely absorbed by the substrate layer. After this, further droplets can be applied or further steps, such as fixing of the created relief, can be carried out.

The height and shape of the produced relief, for example a line relief, then essentially depend on the selected exposure time or the diffusion rate of the selected fluid and its components into the selected substrate. The optimum exposure time can be experimentally determined by determining the amount of fluid remaining on the surface or the height of the relief obtained after energy input and plotting this value against the exposure time.

As the diffusion of the fluid takes place not only in the deep portion of the substrate layer but also laterally, the structure width (e.g. the width of a line) on the surface of the relief will always be somewhat less than the width of the applied droplet or the opening in the mask layer. In the case of a line relief, this will then have a line profile that roughly corresponds to that of a Gaussian distribution curve. This effect can be taken into account, for example, by selecting a larger droplet size around the path of lateral diffusion in order to build up a 50 µm wide relief line on the surface. For example, if one wishes to build up a relief height of 5 µm, the lateral diffusion is also of the order of 5 µm. In order to build up a relief line 50 µm wide and 5 µm high, the line width of the line produced by droplets (or the width of the opening in the mask layer) is therefore preferably made to be 10 μm wider (twice the lateral diffusion), i.e. a 60 μm line is applied. It is thus preferred, in application of droplets whose form and dimensions essentially correspond to the picture elements to be produced, to select their dimensions to be greater than the dimensions of the picture elements to be produced. The dimensions of the droplets are increased by an amount that corresponds to twice the lateral diffusion of the fluid. In this case, the dimensions are understood in particular to be the diameter of points and the length and width of lines. As the lateral diffusion corresponds in a first approximation to the relief height, it is preferable to increase the dimensions by an amount twice the relief height.

If relief heights are to be built up that are greater than the lateral dimension of an individual relief element (for example a 50 μm wide line that is to be 100 μm high), one finds that the formed relief element is in turn highly enlarged and also no longer reaches the necessary relief height. The cause is again the lateral diffusion of the fluid. The fluid diffuses into the adjacent non-image regions. The formed fine relief element therefore does not reach the relief height achieved by a larger relief element, in which the lateral diffusion can be disregarded. In these cases, repeated application of the fluid can be carried out in order to reach the desired relief height. It is also possible to configure the relief structure the relief to be wider at the base and narrower at the tip by correspondingly selecting the droplet size. The person skilled in the art speaks of finishing the height of the relief elements. The finer the element, the lower the relief should be in order to achieve the same compressive stresses for all of the relief elements during printing. However, such finishing should be in the range of at most 10 μm.

In order to bring fine relief elements to the same height as larger relief elements, it may be necessary to scan the area around the fine relief element. By scanning the areas around the elements, the diffusion flow per surface unit can be set to a desired value, and one can thus for example build up a desired relief base around the relief element or configure a flank of a relief element to be steeper or flatter. In other words, the rate of building up the relief, expressed as the relief formed in μm per exposure time, can be set in a targeted manner by means of the number of droplets (or openings in the mask layer) per surface unit at any location of the substrate surface. By forming a base around the fine relief element, the lateral flow-off of the fluid is decreased, and the fine relief element has a relief height that corresponds to the relief height of larger relief elements.

Moreover, in building up of fine relief elements with a high relief height, special geometric effects can occur. The diffusion flow of the fluid depends on the available surface area. A relief edge or a strong relief rounding formed during the diffusion process provides a greater effective surface for the monomer, so that the diffusion flow taking place on the edge or rounding of the relief element is greater than on the previously flat surface. As a result, relief structures with sharply pronounced edges can be produced. These effects can also be compensated for by scanning of the relief elements themselves or by suitable scanning of the environment. In some cases, leveling of the surfaces of the relief elements can also be achieved by mechanical treatment, wherein this treatment takes place in a swollen state (after step d or e), for example by means of a roller, or after step f) by mechanical removal, for example by milling or grinding.

In diffusion of the fluid, depending on whether all of the material penetrates or portions thereof remain on the surface of the substrate, it can be advantageous in optional step e) to remove excess fluid. Here, excess fluid is the part of the applied fluid that has not been transferred to the substrate by diffusion. Removal of the excess fluid can be carried out by a method selected from the group consisting of suctioning off, blowing off, scraping off, shaking off, spinning off, washing off, taking off, swabbing off, removal with a medium, and any desired combinations thereof. However, this step can also be dispensed with entirely, even when not all of the fluid was able to diffuse in.

Before carrying out the fixation according to step f), at least one barrier layer can be applied that on subsequent input of heat and/or radiation can serve to exclude the components from the environment that adversely affect the reactions taking place during this input. The above-mentioned components can be substances or molecules that inhibit or slow reactions, or that lead to side reactions that are accompanied by detrimental effects or produce undesired byproducts. In particular, these include oxygen, which decelerates and influences reactions that take place via radical intermediate stages and can lead to the formation of undesired peroxides, or moisture, which for example slows cationic polymerizations. In this case as well, the above-mentioned layers and materials are suitable as barrier layers. Preferably, $O_2$ barriers are used. However, it can also be advantageous not to use any barrier layer, as unreacted components are then present that enable better bonding of a further layer applied to the relief in an aftertreatment according to the optional following step g). The application of such a layer can additionally have a leveling effect on the surfaces of the elevated relief areas and lead to structures with surfaces that are flat and of equal height. In printing applications, a flat surface of areas to be printed is advantageous for favorable ink transfer.

For application of the barrier layer, all common methods for applying solid and/or liquid layers can be used, such as e.g. placing, laminating on, drum application, spraying on, pouring on, rolling on, painting on, immersion, extrusion, formation of a barrier by migration of components of the substrate layer onto the surface, and any desired combinations thereof. Optionally, in particular in application of liquid formulations, further treatment steps may be necessary, such as e.g. drying, rolling, cooling off, and any desired combinations. Preferably, these layers can also be removed by simple methods, which is possible both by physical methods such as peeling off, rubbing off, abrasion, milling, and/or ablation and by chemical methods such as treatment with solvents, water or aqueous solutions and any desired combinations thereof. Preferably, the protective layer is peeled or rinsed off.

As an alternative to a barrier layer, the fixing of the relief according to step f) can also take place in an inert atmosphere, for example in noble gases, $CO_2$ and/or nitrogen, or under a liquid such as water.

In step f), by means of input from an energy source, the relief is subjected to heat and/or radiation and at least one reaction is triggered that fixes the produced relief structure. Polymerization and/or crosslinking reactions can be used as reactions, such as e.g. a radical, ionic, condensation, or addition reaction and any desired combinations thereof. Preferred are radical polymerization and/or crosslinking.

As energy sources, heat sources and/or sources of electromagnetic radiation can be used. Among heat sources, all sources known to the person skilled in the art are usable, such as e.g. ovens, IR emitters or lamps, microwave generators, and any desired combinations thereof. Plasmas can also be used as energy sources, wherein these can be high-pressure, standard-pressure, and/or low-pressure plasmas, cold and/or hot plasmas, non-ideal plasmas, and/or dense plasmas. All methods known to the person skilled in the art can be used for excitation, such as e.g. thermal excitation, chemical excitation, electrostatic excitation, radiation excitation, electromagnetic excitation, inductive excitation and/or microwave excitation.

The temperature can vary in the range of 20° C. to 200° C., preferably in the range of 30° C. to 200° C., particularly preferably in the range of 40° C. to 180° C., and most particularly preferably in the range of 50° C. to 150° C. Usable as sources of electromagnetic radiation are lamps, flash lamps, fluorescent lamps, emitters, laser, and light-emitting diodes (LED). Irradiation can be carried out over a large area or a small area (approximately point-liked) by means of guided laser beams or spatially resolved projection of electromagnetic radiation. The wavelength of the incident electromagnetic waves is in the range of 200 nm to 20000 nm, preferably in the range of 250 nm to 1100 nm, particularly preferably in the UV region, and most particularly preferably in the range of 300 nm to 450 nm. In addition to broad-band irradiation with the electromagnetic waves, it can be advantageous to use narrow-band or monochromatic wavelength regions, such as those that can be produced using corresponding filters, lasers, or light-emitting diodes (LEDs). In these cases, wavelengths in the ranges of 350 nm, 365 nm, 385 nm, 395 nm, 400 nm, 405 nm, 532 nm, 830 nm, 1064 nm (and approx. 5 nm to 10 nm above and/or below) are preferred, individually or in combinations.

The irradiation can be carried out on a continuous or pulsed basis, or in several short periods of continuous radiation. The intensity of the radiation can vary over a wide range, wherein it must be ensured that a dose is used that is high enough to sufficiently stabilize the swollen substrate layer for subsequent use. After further thermal treatments, the radiation-induced reaction may possibly also have progressed to the extent that the swollen areas of the substrate layer are at least partially insoluble and/or not meltable/liquefiable. The intensity and dose of the radiation depend on the reactivity of the formulation and the aggressiveness of the development. The intensity of the radiation is in the range of 1 mW/cm$^2$ to 15,000 mW/cm$^2$, preferably in the range of 5 mW/cm$^2$ to 5,000 mW/cm$^2$, and particularly preferably in the range of 10 mW/cm$^2$ to 1,000 mW/cm$^2$. The dose of the radiation is in the range of 0.3 J/cm$^2$ to 6,000 J/cm$^2$, preferably in the range of 3 J/cm$^2$ to 100 J/cm$^2$, and particularly preferably in the range of 6 J/cm$^2$ to 20 J/cm$^2$. Inputting of the energy source can also take place in an inert atmosphere, for example in noble gases, $CO_2$ and/or nitrogen, or under a fluid, for example water.

Depending on the form of the layer construction, various devices may be used for treatment with electromagnetic radiation. In planar geometry, so-called flat-bed exposure units can be used, and in curved or cylindrical geometries, drum exposure units can be used. In the case of drum exposure units, the relief structures can be guided on rotating drums past one or a plurality of light sources once or several times, wherein the rotation rate and frequency can be varied. In flat-bed exposure units, either several sources are arranged such that they irradiate the surface in a uniform manner, or one or a plurality of sources are guided over the relief structure such that all areas are exposed to the same dose. Preferably, a longitudinal light source (e.g. an LED strip) and the relief are moved relative to each other at a constant rate. In another preferred possibility, a light source is moved in combination with the nozzle, and exposure is carried out on application of the last layer immediately after deposition of the droplets.

Following the preceding steps, further treatment steps can optionally be carried out for aftertreatment (step g). These include for example mechanical treatment, thermal treatment, drying, treatment with electromagnetic beams, application of identification features, cutting to size, coating, and any desired combinations thereof. A thermal treatment can be used for example to initiate and/or complete reactions, increase the mechanical and/or thermal resistance of the relief structure, and remove volatile components. For thermal treatment, the known methods can be used, such as e.g. heating using heated gases or liquids, IR radiation, and any desired combinations thereof. In this treatment, ovens, blowers, lamps, emitters, and any desired combinations thereof and can be used.

For example, a treatment with electromagnetic radiation can be used to make the surfaces of the relief structure non-sticky or to initiate and/or complete the polymerization and/or crosslinking reactions. The wavelength of the incident electromagnetic waves is in the range of 200 nm to 2000 nm, preferably in the UV region, particularly preferably in the range of 250 nm to 550 nm, and most particularly preferably in the range of 300 nm to 450 nm. In addition to broad-band irradiation with the electromagnetic waves, it can be advantageous to use narrow-band or monochromatic wavelength regions such as those that can be produced using corresponding filters, lasers or light-emitting diodes (LEDs). In these cases, wavelengths in the ranges of 350 nm, 365 nm, 385 nm, 395 nm, 400 nm, 405 nm, 532 nm, 830 nm, and 1064 nm (and approx. 5 nm to 10 nm above and/or below) are preferred, individually or in combinations. Non-stickiness is preferably achieved by means of irradiation with UV-C light, wherein preferably fluorescent lamps are used. UV-C light has a wavelength in the range of 100 nm to 280 nm. High-energy laser radiation can be used to remove parts of the relief structures, for example in order to increase the heights of the relief structures or structure the surface of the raised areas.

A treatment with fluids such as e.g. solvents and/or aqueous solutions (alkaline solutions or acids) or abrasive media such as e.g. particle or fluid jets can be used in order to further increase the relative height of the relief structures, as the untreated areas of the substrate layer are more sensitive and less stable and are more quickly and more extensively removed and/or dissolved.

In a further aftertreatment, the side of the substrate layer or the layer construction opposite the relief structure can be treated over its entire surface with a fluid that comprises a first reactive component, this fluid is allowed to at least partially exert its action, and it is then exposed to an energy source.

In a further possible aftertreatment, a thermal treatment can lead to at least partial liquefication of the areas that were not treated with the at least one fluid. These non-fixed areas can then be removed, and the relief height can thus be additionally increased. In order to remove the viscous/liquid areas, all processes and methods familiar to the person skilled in the art can be used, such as e.g. blowing off, suctioning off, swabbing off, blasting off (with particles and/or droplets), scraping off, wiping off, transferring to a developing medium, and any desired combinations thereof. Preferably, the liquid material is taken up with a developing medium (absorbed and/or adsorbed) that is continuously brought into contact with the surface of the layer structure. Suitable for use as developing media are papers, woven fabrics, nonwoven fabrics, or films that can take up the liquefied material and can be composed of natural and/or plastic fibers. Preferably, nonwoven fabrics or nonwoven fabric webs of polymers such as celluloses, cotton, polyesters, polyamides, polyurethanes and any desired combinations thereof are used that are stable at the temperatures used in development.

A mechanical treatment can be used to level the surfaces of the relief structures, structure the surface of the relief structures, and/or influence the height of the relief structures. For leveling purposes, all mechanical methods that involve laminar removal are usable, such as e.g. milling, grinding, planing, stamping, and any desired combinations thereof. For example, structuring of the surfaces can be achieved by stamping, grinding, and any combinations thereof. Mechanical changes in the relief height are preferably achieved using abrasive methods that remove the less stable areas of the relief. Particular examples of this would be blasting with abrasive particles or fluid jets. By means of these methods a uniform height and flat surface of the elevated relief areas are achieved. This can also be used for roughening of the surface, which can increase ink transfer in printing applications.

Preferably, steps c) and d) of the method are carried out only one time each.

Optionally, in particular when high relief heights are to be achieved, steps c) to f) or c) to g) can be repeated once or several times. The number of repetitions of the individual steps and the combination of steps depends on the relief height to be reached and is in the range of 1 to 100, preferably in the range of 1 to 50, particularly preferably in the range of 1 to 10, and most particularly preferably in the range of 1 to 5. For example, if a barrier layer was used prior to the fixing according to step f), this layer is to be removed prior to the renewed application of fluid according to step c).

Moreover, it is possible to repeat steps c) and d) at least once or several times before carrying out step e) and the following steps f) and g). The number of repetitions of the individual steps and the combination of steps depends on the relief height to be reached and is preferably in the range of 1 to 100, particularly preferably in the range of 1 to 50, more particularly preferably in the range of 1 to 10, and most preferably in the range of 1 to 5. These repetitions make it possible to apply large amounts of the fluid and allow it to penetrate into the substrate layer in order to achieve greater relief heights.

It is also possible in the method to repeat steps c) and d) or c) to e) at least once or several times before carrying out step f) and the optional following step g). The number of repetitions of the individual steps and the combination of steps depends on the relief height to be reached and is preferably in the range of 1 to 100, particularly preferably in the range of 1 to 50, more particularly preferably in the range of 1 to 10, and most preferably in the range of 1 to 5. In these cases, the amount of fluid applied can also be increased, wherein during also repeated rinsing away of the excess fluid according to step e), the resolution is less strongly affected.

Moreover, it is possible to repeat each of method steps c) and d) or c) to e) at least once or several times before carrying out step f) and the optional step g). The number of repetitions of the individual steps and the combination of steps depends on the relief height to be reached and is preferably in the range of 1 to 100, particularly preferably in the range of 1 to 50, more particularly preferably in the range of 1 to 10, and most preferably in the range of 1 to 5. Excessive input of energy is prevented by the fixation according to step f); otherwise, this could lead to an excessive increase in the stiffness of the relief and/or the substrate layer.

The substrate layer comprises a binder, optionally at least one second reactive component, and optionally further components.

The at least one first reactive component and/or the second reactive component is/are preferably selected from the group consisting of a polymer, an oligomer, a monomer, a low-molecular compound, a catalyst, an initiator and combinations of at least two of these components. Preferably, the first and the second reactive component respectively are selected from this group independently of one another.

Preferably, in addition to the at least one first reactive component, the fluid comprises further components such as solvents and additives.

Preferably, the substrate layer comprises at least one second reactive component, which can be selected from an initiator, a catalyst, a polymer, an oligomer, a monomer and any desired combinations thereof. The at least one second component is capable of a reaction; this capacity to react can derive from the component itself or corresponding chemical groups or functional groups. As reactions, polymerization and/or crosslinking reactions can be used, such as e.g. a radical, ionic, condensation, or addition reaction, and any desired combinations thereof. Particularly preferred as condensation reactions are reactions of acids, preferably polyfunctional acids, such as e.g. dicarboxylic acids, with alcohols, preferably polyfunctional alcohols, e.g. diols, polyols, amines, preferably polyfunctional amines, polyamines, of phenols, preferably polyfunctional phenols, e.g. dihydroxyphenol, bisphenol A, polyphenols, with aldehydes, preferably polyfunctional aldehydes, which can also be metal-catalyzed. There is also the condensation reaction of silanols with one another and with alkoxysilanes or other compounds with Si—OR, Si—C(=O)—OR, Si—NR$_2$ groups, wherein R can be an organic radical.

Among the addition reactions, reactions of isocyanates with alcohols or epoxides with alcohols, and also in the presence of amines and/or anhydrides, and/or of unsaturated double bonds, preferably polyfunctional compounds, e.g. dienes or polyenes, such as e.g. polysiloxanes with at least 2 C=C double bonds, with Si—H groups, preferably polyfunctional compounds with several Si—H groups, e.g. polysiloxanes with Si groups, preferably in the presence of catalysts such as e.g. noble metal compounds, are preferred. Moreover, cycloaddition reactions such as e.g. Diels-Alder additions, so-called "click chemistry," or azide-alkyne cycloadditions can be used. In addition, homo- and heterocoupling reactions that are catalyzable by metals, in particular transition metals, can be used, such as e.g. C—C cross-coupling reactions using organometallic compounds or activated CH bonds (e.g. Kumada, Negishi, Suzuki, Heck, Sonogashira coupling), oxidative homo- and heterocoupling reactions (e.g. Glaser reactions), N—C(Buchwald-Hartwig amination), O—H, S—H, Si—C couplings or olefin metathesis reactions (e.g. ring opening metathesis polymerization ROMP).

In particularly reactive combinations, the separation of the components in the fluid and the substrate layer increases the storage stability of the entire system, as a reaction occurs only if the two reaction partners come together. For example, in use of isocyanates and alcohols, the isocyanate may be present in the substrate layer and the alcohol in the fluid, or vice versa. In catalyzed reactions, the catalyst can be applied with the fluid, and the reaction can be started by energy input in the form of heat.

Preferably, the reaction is a radical polymerization and/or crosslinking. This also includes controlled free-radical polymerization reactions, such as e.g. so-called RAFT polymerization (reversible addition-fragmentation chain transfer or reversible addition-fragmentation chain transfer reaction), so-called atom transfer radical polymerization (ATRP), and nitroxide-mediated polymerization (NMP).

The second reactive component can be a low-molecular, oligomeric, or high-molecular compound or any desired combinations thereof. In the case of oligomeric or polymeric compounds, these can be linear, branched, star-shaped and/or dendritic structures that can be composed of one or a plurality of basic building blocks, which in turn can be in block form, alternating, or statistically arranged.

Preferably, the at least one second reactive component comprises at least one reactive group selected from the group consisting of a C—C double bond, C—C triple bond, acryl group, methacryl group, vinyl ether group, vinyl ester group, thiol-vinyl ester group, vinyl carbonate group, —S—H group, —N—H$_n$(CH$_x$R$_y$)$_m$ (where n+m=2 and m≥1 and x+y=3 and x≥1), and any desired combinations thereof. Particularly preferable are C—C double bonds, C—C triple bonds, acryl groups, methacryl groups, vinyl ether groups, and most particularly preferably acryl groups and methacryl groups. The second reactive component should carry at least one of the above-mentioned reactive groups, but can also have two or more of the reactive groups, which is particularly advantageous in crosslinks and is preferably used in such cases.

Examples of low-molecular second reactive components are polybutadiene oils, acrylated or methacrylated polybutadienes, liquid isoprene polymers and/or styrene-diene copolymers.

Preferably, the substrate layer comprises a second reactive component in the form of an ethylenically unsaturated compound that contains at least one ethylenically unsaturated group. Suitable as ethylenically unsaturated compounds are those that are compatible with the respectively selected polymeric binders. In general, these compounds are not gaseous at room temperature. Preferably, the ethylenically unsaturated compound comprises at least 2 ethylenically unsaturated groups, particularly preferably 2 to 6 ethylenically unsaturated groups, and most particularly preferably 2 ethylenically unsaturated groups. In special cases, there can also be a large number of ethylenically unsaturated groups present, such as e.g. in polybutadienes. Compounds with C—C triple bonds can also be used in the substrate layer. Preferably, the ethylenically unsaturated group is at least one acrylate and/or methacrylate group, but acrylamides and vinyl ethers can also be used. The ethylenically unsaturated compound can be in the form of a monomer, oligomer, or polymer, may be in linear, branched, star-shaped, or dendritic form, and has a molecular weight in the range of less than 50,000 g/mol. Preferably, the molecular weight is less than 30,000 g/mol, particularly preferably less than 10000 g/mol, and most particularly preferably less than 5000 g/mol and can also be less than 300 g/mol.

In particular derivatives of acrylic and/or methacrylic acid, such as esters thereof with mono- or polyhydric alcohols, for example acrylic or methacrylic acid esters of alkanals with 1 to 20 carbon atoms, such as methyl methacrylate, ethyl acrylate, propyl (meth)acrylate, isopropyl (meth)acrylate, n-butyl (meth)acrylate, isobutyl (meth)acrylate, tert-butyl (meth)acrylate, hexyl (meth)acrylate, cyclohexyl (meth)acrylate, 2-ethylhexyl (meth)acrylate, lauryl (meth)acrylate, (meth)acrylic esters of polyhydric alcohols with 2 to carbon atoms, e.g. 2-hydroxyethyl (meth)acrylate, 2-hydroxypropyl (meth)acrylate, ethylene glycol di(meth)acrylate, polyethylene glycol di(meth)acrylate, butane diol-1,4-di(meth)acrylate, neopentyl glycol di(meth)acrylate, 3-methylpentanediol di(meth)acrylate, 1,1,1-trimethylolpropane tri(meth)acrylate, 1,4-butanediol diacrylate, 1,6-hexanediol diacrylate, 1,6-hexanediol dimethacrylate, 1,9-nonanediol diacrylate, di, tri- and tetraethylene glycol di(meth)acrylate, tripropylene glycol di(meth)acrylate or pentaerythritoltetra(meth)acrylate, furthermore poly(ethylene oxide) di(meth)acrylate, m-methylpoly(ethylene oxide)-yl-(meth)acrylate, N,N-diethylaminoethyl acrylate, a reaction product of 1 mol glycerol, 1 mol epichlorohydrin and 3 mol acrylic acid and glycidyl methacrylate and bisphenol-A-diglycidyl ether acrylate.

Also suitable are derivatives of acrylamide and of methacrylamide, such as e.g. ethers of their N-methylol derivatives with mono- and polyhydric alcohols, e.g. ethylene glycol, glycerol, 1,1,1-trimethylolpropane, oligomeric or polymeric ethylene oxide derivatives. These are particularly suitable when polyamides or polyvinyl alcohol is/are used as a binder.

Suitable are also so-called epoxide and urethane (meth) acrylates, such as can be obtained for example by reacting bisphenol-A-diglycidyl ether with (meth)acrylic acid or by reacting diisocyanates with hydroxyalkyl (meth)acrylates or with hydroxyl-group-containing polyesters or polyethers. Moreover, suitable olefinically unsaturated compounds are esters of acrylic or methacrylic acid, in particular those with low vapor pressure and those modified with compatibilizers, e.g. with hydroxy, amido, sulfoester, or sulfonamide groups. Mixtures of the above-mentioned copolymerizable ethylenically unsaturated organic compounds can also be used.

In an embodiment, the ethylenically unsaturated compound used as a second reactive component is contained in a concentration in the range of 0.5 wt. % to 60 wt. % based on the total weight of the substrate layer, preferably in the range of 1 to 50 wt. %, particularly preferably in the range of 1 wt. % to 40 wt. %, and most particularly preferably in the range of 5 wt. % to 40 wt. %.

Preferably, the first and the second reactive component are not identical. As a rule, the first reactive component is selected such that a high diffusion rate and thus a low exposure time result. The second reactive component need not have a high diffusion rate, as it is homogeneously distributed in the substrate layer. The first reactive component should therefore be low-molecular. However, the first reactive component and the second reactive component can also be identical. In this case, the diffusion rate can be partially controlled by adjusting the concentration of the second reactive component in the substrate layer.

In cases where the diffusion rate of the first reactive component into the substrate layer is low and the diffusion rate of the second reactive component into the droplets is higher, the second reactive component is preferably an initiator and/or catalyst. On inputting of the energy source, the fluid is fixed on the substrate surface.

Preferably, the at least one substrate layer comprises as a second reactive component at least one catalyst or initiator that is capable of starting and/or catalyzing a reaction by absorbing the input energy. In particular, catalysts and initiators can be used that form active species on thermal treatment or irradiation with electromagnetic waves. Radicals, ions, complexes and coordination compounds can be used as reactive species. Examples of catalysts are cobalt and zinc salts that catalyze condensation reactions, platinum complexes that catalyze hydrosilylation, and amines that catalyze the crosslinking of epoxides. Examples of initiators that can initiate ionic reactions are for example ferrocenes (e.g. (5-cyclopentadienyl)(6-isopropylbenzene)iron hexafluorophosphate) and onium salts such as iodonium and sulfonium salts that produce ions on thermal loading and/or irradiation and can initiate cationic polymerization and/or crosslinking. Some of these onium salts can also be used to produce radicals if formation of the ions takes place via a radical intermediate stage. Particularly preferable are initiators or initiator systems of two or more components that thermally or photochemically produce radicals, which in turn can bring about radical polymerization and/or crosslinking. For example, the thermally activatable initiators include diazo compounds (e.g. AIBN) and peroxides (benzoyl peroxide). In the use of initiator systems consisting of more than one component, it can be advantageous to use a component, preferably the more slowly diffusing component, as a second reactive component in the substrate layer and to use a further, preferably the more rapidly diffusing component, as a further component in the at least one fluid. In particularly reactive combinations, the separation of the components in the fluid and the substrate layer increases the storage stability of the entire system, as a reaction occurs only if the two reaction partners come together.

Preferably, the substrate layer comprises as a second reactive component initiators or initiator systems composed of at least two components, which on irradiation with electromagnetic waves produce radicals that cause polymerization and/or crosslinking. Such initiators are known to the person skilled in the art and are described for example in the following literature: Bruce M. Monroe at al., Chemical Review, 93, 435 (1993), R. S. Davidson, Journal of Photochemistry and Biology A: Chemistry, 73, 81 (1993), J. P. Faussier, Photoinitiated Polymerization—Theory and Applications: Rapra Review, Vol. 9, Report, RapraTechnology (1998), M. Tsunooka at al., 25 Prog. Polym. Sci., 21, 1 (1996), F. D. Saeva, Topics in Current Chemistry, 1 56, 59 (1990), G. G. Maslak, Topics in Current Chemistry, 168, 1 (1993), H. B. Shuster at al., JAGS, 112, 6329 (1990) and I. D. F. Eaton at al., JAGS, 102, 3298 (1980), P. Fouassier and J. F. Rabek, Radiation Curing in Polymer Science and Technology, pp. 77 to 117 (1993) or K. K. Dietliker, Photoinitiators for Free Radical and Cationic polymerization, Chemistry & Technology of UV & EB Formulation for Coatings, Inks and Paints, Volume 3, Sita Technology Ltd., London 1991; or R. S. Davidson, Exploring the Science, Technology and Applications of U. V. and E. B. Curing, Sita Technology Ltd., London 1999. Further initiators are described in JP45-37377, JP44-86516, U.S. Pat. Nos. 3,567, 453, 4,343,891, EP109772, EP109773, JP63138345, JP63142345, JP63142346, JP63143537, JP4642363, JP59152396, JP61151197, JP6341484, JP2249 and JP24705, JP626223, JPB6314340, JP1559174831, JP1304453 and JP1152109.

Preferred are initiators or initiator systems from the group of initiators generally referred to as Norrish type I or Norrish type II, which are based on an H abstraction or electron transfer. The Norrish type I initiators include for example benzoyl radical forming initiators, α-hydroxyketones, α-aminoketones, acyl phosphine oxides, bisacyl phosphine oxides, triazines and hexaarylbisimidazoles, which can additionally be combined with dyes or sensitizers in order to increase sensitivity. Among the Norrish type II initiators, combinations of ketones or aldehydes with H transfer agents such as e.g. amines or thiols should be mentioned in particular. Preferably, the initiators are selected from the group consisting of benzyl dimethyl ketal, diphenyl(2,4,6-trimethylbenzoyl)phosphine oxides, 2,4,6-trimethylbenzoylphenyl phosphinates; bis(2,4,6-trimethylbenzoyl)-phenylphosphine oxides, bis(2,6-dimethoxybenzoyl)-2-1,4-trimethylpentyl) phosphine oxides, Michler's ketone, benzophenones alone and/or combined with sensitizers, amines or thiols and any desired combinations thereof. Further suitable initiators are onium salts, organic peroxides, thio compounds, ketoximes, borates, azinium and azo compounds, metallocenes and compounds with a carbon-halogen group, which can also be used in combination or together with sensitizers, amines or thiols. Examples of usable sensitizers include xanthones, thioxanthones, anthracenes, perylenes, phenothiazines, benzophenones, acetophenones and dyes. The prerequisite for sensitization is that either the triplet energy of the sensitizer is higher than that of the initiator to be sensitized, or it must be possible for electron transfer from an excited state of the sensitizer to occur.

Preferably, the substrate layer comprises the initiator or the initiator system in a concentration in the range of 0.1 wt. % to 20 wt. % based on the total weight of the substrate layer. Preferred concentrations are in the range of 1 to 10 wt. %, particularly preferably in the range of 1 wt. % to 8 wt. %, and most particularly preferably in the range of 2 wt. % to 6 wt. %.

The substrate layer can optionally contain further components that can be selected from the group consisting of a solvent, a stabilizer, a dye, a pigment, an additive, a surfactant substance, a UV absorber, a regulator, a plasticizer, a binder, a, and any desired combinations thereof.

In further embodiments, the substrate layer can contain further components selected from the group consisting of a plasticizer, a solvent, a binder, a coloring agent, a stabilizer, a regulator, a UV absorber, a dispersion auxiliary, a crosslinker, a viscosity modifier, a surfactant substance and any desired combinations thereof. These additives or auxiliaries and adjuvants are contained in the substrate layer in a total concentration in the range of 0.001 wt. % to 60 wt. % based on the total weight of the substrate layer, preferably in the range of 0.01 wt. % to 50 wt. %, particularly in the range of 0.1 to 50 wt. %, and most particularly in the range of 1 wt. % to 50 wt. %. The individual additives are contained in concentrations of 0.001 wt. % to 40 wt. % based on the total weight of the substrate layer, preferably in the range of 0.01 wt. % to 40 wt. %, particularly in the range of 0.1 wt. % to 40 wt. %, and most particularly in the range of 0.1 wt. % to 35 wt. %.

Mixtures of different plasticizers can also be used. Examples of suitable plasticizers include modified and unmodified natural oils and resins, such as high-boiling paraffinic, naphthenic or aromatic mineral oils, synthetic oligomers or resins such as oligostyrene, high-boiling esters, oligomeric styrene-butadiene copolymers, oligomeric [alpha]-methyl styrene/p-methyl styrene copolymers, liquid oligobutadienes, in particular those with a molecular weight between 500 g/mol and 5000 g/mol, or liquid oligomeric acrylonitrile butadiene copolymers or oligomeric ethylenepropylene-diene copolymers. Preferred are polybutadiene oils (liquid oligobutadienes), in particular those with a molecular weight between 500 g/mol and 5000 g/mol, high-boiling aliphatic esters such as in particular alkyl mono- and dicarboxylic acid esters, for example stearates or adipates, and mineral oils. Particularly preferable are high-boiling, essentially paraffinic and/or naphthenic mineral oils. For example, so-called paraffin basic solvates and special oils are commercially available under the names Shell Catenex S and Shell Catenex PH. The person skilled in the art makes a distinction with respect to mineral oils between technical white oils, which can still have an extremely low aromatic content, and medicinal white oils, which are essentially free of aromatics. They are both commercially available and equally suitable. Particularly widespread as plasticizers are white oils or oligomeric plasticizers, such as in particular polybutadiene oils, carboxylic acid esters, and phthalates. EP992849 and EP2279454 are mentioned here by way of example. The amount of an optionally present plasticizer is determined by the person skilled in the art depending on the desired properties of the substrate layer. As a rule, the amount will not exceed 50 wt. % of the total of all components of the substrate layer, and it is generally 0.1 wt. % to 50 wt. %, preferably 0.05 wt. % to 40 wt. %.

Elastomeric binders suitable for the substrate layer are known to the person skilled in the art. Both hydrophilic and hydrophobic binders can be used. Examples include ethylene-acrylic acid copolymers, polyethylene oxide, polyvinyl alcohol graft copolymers, natural rubber, polybutadiene, polyisoprene, styrene-butadiene rubber, nitrile-butadiene rubber, butyl rubber, styrene-isoprene rubber, styrene-butadiene-isoprene rubber, polynorbornene rubber or ethylene-propylene-diene rubber (EPDM). Preferably, hydrophobic binders are used. Such binders are soluble or at least swellable in organic solvents, while they are largely insoluble in water and are also not or at least not substantially swellable in water.

Preferably, the elastomer is a thermoplastic elastomeric block copolymer of alkenyl aromatics and 1,3-dienes. The block copolymers can be linear, branched, or radial block copolymers. Ordinarily, they are triblock copolymers of the A-B-A type, but they can also be diblock polymers of the A-B type, or those with several alternating elastomeric and thermoplastic blocks, e.g. A-B-A-B-A. Mixtures of two or several different block copolymers can also be used. Commercially available triblock copolymers often contain certain amounts of diblock copolymers. The diene units can be 1,2- or 1,4-linked. Both block copolymers of the styrene-butadiene or styrene-isoprene type and of the styrene-butadiene-isoprene type can be used. For example, they are commercially available under the brand name Kraton. Also usable are thermoplastic elastomeric block copolymers with end blocks of styrene and a statistical styrene-butadiene middle block that are available under the brand name Styroflex. The block copolymers can also be completely or partially hydrogenated, such as e.g. in SEBS rubbers. Most particularly preferred are triblock copolymers of the type A-B-A or radial block copolymers of the type (AB)n, wherein A is styrene and B is a diene. Most particularly preferred are triblock copolymers of the type A-B-A, radial block copolymers of the type (AB)n, wherein A is styrene and B is a diene, and statistical copolymers and random copolymers of styrene and a diene.

Particularly preferably, the thermoplastic elastomeric binders are at least one styrene-isoprene block copolymer, in particular a styrene-isoprene-styrene block copolymer, wherein the polymers can also contain portions of styrene-isoprene diblock copolymers. Preferred binders of the styrene-isoprene type contain as a rule 10 wt. % to 30 wt. %, preferably 12 wt. % to 28 wt. % and particularly preferably 14 wt. % to 25 wt. % styrene. These block copolymers ordinarily have an average molecular weight Mw (weight average) of 100,000 to 300,000 g/mol. Of course, mixtures of different styrene-isoprene block copolymers can also be used.

Moreover, radial isoprene-styrene block copolymers can preferably be used. The isoprene units in the polyisoprene blocks can be 1,4-linked, i.e. the remaining double bond is arranged in the chain, or 3,4-linked, i.e. the remaining double bond is arranged on the side. Block copolymers can be used that essentially comprise 1,4 linkages and binders that comprise certain amounts of 3,4 linkages. The side vinyl groups in binders with 3,4-linked isoprene units can also react during crosslinking of the substrate layer and accordingly produce a plate with a high degree of crosslinking. For example, styrene-isoprene block copolymers can be used that have a vinyl group content of 20% to 70%.

A radial styrene-isoprene copolymer having a vinyl group content of less than 10 mol % can preferably be used as a binder. Particularly preferably, a mixture of two different styrene-isoprene block copolymers is used. One of the two preferably has a vinyl group content of at least 20 mol %, in particular 20 mol % to 70 mol %, preferably 25 mol % to 45 mol %. The other can have a low vinyl group content, for example of less than 10 mol %. Moreover, a mixture of two styrene-isoprene copolymers can preferably be used, one of which has a high diblock content (styrene-isoprene) of more than 40 wt. %, and the second of which has a lower diblock content of less than 30 wt. %. In addition to the above-mentioned thermoplastic-elastomeric block copolymers, in particular the styrene-isoprene block copolymers, the photopolymerizable layer can also comprise further elastomeric binders that differ from the block copolymers. With such additional binders, also referred to as secondary binders, the properties of the substrate layer can be modified. An example of secondary binders are vinyl toluene-α-methyl styrene copolymers. As a rule, the amount of such secondary binders should not exceed 25 wt. % with respect to the total amount of all binders used. Preferably, the amount of such secondary binders does not exceed 15 wt. %, particularly preferably not 10 wt. %. The total amount of binders is ordinarily 40 wt. % to 90 wt. % with respect to the total of all components of the substrate layer, preferably 50 wt. % to 90 wt. % and particularly preferably 60 wt. % to 85 wt. %.

Inhibitors of thermal polymerization that do not show any significant self-absorption in the actinic region in which the photoinitiator is absorbed can be added to the substrate layer, such as e.g. 2, 6-di-tert-butyl-p-cresol, hydroquinone, p-methoxyphenol, β-naphthol, phenothiazine, pyridine, nitrobenzene, m-dinitrobenzene or chloranil; thiazine dyes such as Thionine Blue G (C.I. 52025), Methylene Blue B (C.I. 52015) or Toluidine Blue (C.I. 52040); or N-nitrosamines such as N-nitrosodiphenylamine, or the salts, for example the potassium, calcium, or aluminum salts of N-nitroso cyclohexyl hydroxylamine. Moreover, other inhibitors or stabilizers can also be used, such as described e.g. in A Valet, Light-Protective Agents for Lacquers, pp. 33 ff., Vincentz Verlag Hannover 1996, in particular sterically hindered phenols and amines.

Suitable coloring agents, dyes, pigments, or photochromic additives can also be added to the substrate layer in an amount of 0.0001 wt. % to 2 wt. %, based on the total weight of the substrate layer. They are used for controlling the exposure properties, as regulators, for identification, the direct control of the exposure result, or for esthetic purposes. A prerequisite for the selection and the amount of such additives is that they disrupt the photopolymerization of the mixtures to just as low a degree as the inhibitors of the thermally initiated polymerization. Suitable are e.g. the soluble phenazinium, phenoxazinium, acridinium, and phenothiazinium dyes, such as Neutral Red (C.I. 50040), Safranin T (C.I. 50240), Rhodanil Blue, the salt or amide of Rhodamine D (Basic Violet 10, C.I. 45170), Methylene Blue B (C.I. 52015), Thionine Blue G (C.I. 52025), or Acridine Orange (C.I. 46005); and also Solvent Black 3 (C.I. 26150). These dyes can also be used together with a sufficient amount of a reducing agent that does not reduce the dye in the absence of actinic light, but on exposure can reduce the dye in the excited electron state. Examples of such mild reducing agents are ascorbic acid, anethol, thiourea, e.g. diethyl allylthiourea, in particular N-allylthiourea, and hydroxylamine derivatives, in particular salts of N-nitroso cyclohexyl hydroxylamine, preferably the potassium, calcium, and aluminum salts. As mentioned above, the latter can simultaneously serve as inhibitors of the thermally initiated polymerization. The reducing agents can generally be added in amounts of 0.005 wt. % to 5 wt. %, based on the total weight of the substrate layer, wherein in many cases the addition of a 3- to 10-fold amount of the included dye has been found to be effective.

The addition of UV absorbers to the substrate layer can also be advantageous and can positively affect the relief formation. Compounds suitable as UV absorbers include those described e.g. in A. Valet, Light-Protective Agents for Lacquers, pp. 20 ff., Vincentz Verlag Hannover 1996, such as e.g. hydroxyphenyl-benzotriazoles, hydroxybenzophenones, hydroxyphenyl-s-triazines, oxalanilides, hydroxyphenyl pyrimidines, salicylic acid derivatives, and cyanoacrylates and any desired combinations thereof.

The surfactant substances include compounds that tend in a particular composition to collect at the surface of the material of the substrate layer. These include in particular surfactants, amphiphilic molecules with hydrophobic and hydrophilic areas, and block copolymers and oligomers containing blocks having a lower surface energy. However, low- to high-molecular substances can also be used that are incompatible with the formulation of the substrate layer and/or, because of their particularly low surface energy, migrate to the surface, for example waxes, silicones, silanes and fluorinated compounds. Preferably, waxes are used, such as e.g. paraffin waxes, polyethylene waxes, polypropylene waxes, and any desired mixtures thereof. Preferably, the substrate layer comprises at least one wax in a concentration in the range of 0.1 wt. % to 10 wt. % based on the total weight of the substrate layer. Preferably, the wax concentration is in the range of 0.2 to 5 wt. %, particularly preferably in the range of 0.5 wt. % to 5 wt. %, and most particularly preferably in the range of 0.5 wt. % to 4 wt. %.

These surfactant substances, and the waxes in particular, can exert an action as a mobile blocking layer for oxygen and/or prevent excessive spreading of the applied fluid droplets. This increases the rate of oxygen-inhibited fixation reactions and increases detail accuracy. The use of relatively low-molecular waxes and surfactant substances is advantageous in that they always tend to migrate to the freshly produced surface, thus allowing the blocking or anti-spreading function to be continuously refreshed between the individual application steps. Preferably, with elastomeric binders such as e.g. styrene-butadiene rubbers, nitrile-butadiene rubbers, butyl rubbers, styrene-isoprene rubbers, and styrene-butadiene-isoprene rubbers, waxes such as e.g. paraffin waxes, polyethylene waxes, and polypropylene waxes are used.

Preferably, the viscosity of the at least one fluid is in the range of 0.1 mPa·s to 10 Pas, preferably in the range of 0.1 mPa·s to 1 Pas, particularly preferably in the range of 0.1 to 500 mPa·s, and most particularly preferably in the range of 0.1 mPa·s to 200 mPa·s. In a special embodiment, the viscosity is in the range of 0.1 mPa·s to 10 mPa·s. The data on viscosity are based on a temperature of 20° C.

Preferably, the surface tensions of the substrate surface and the fluid are selected such that the greatest possible contact angle arises between the surface of the substrate layer and the fluid and large-area spreading of the fluid is prevented. The contact angle is preferably in a range of 5° to 110°, preferably in the range of 5° to 90°, particularly preferably in the range of 5° to 50°. This is possible in that the surface tension of the substrate layer is reduced, for example by using binders with low surface tension and/or surfactant substances such as e.g. waxes. Moreover, the surface tension of the substrate layer can be modified by applying a material with low surface tension, for example by applying waxes or fluorinated compounds.

The surface tension of the fluid can also be increased, for example, by using polar substances and/or polar additives such as e.g. polar solvents and additives. The created mixtures can be solutions, emulsions and/or suspensions. The selection of the suitable combinations of fluid and substrate layer can be optimized by means of simple contact angle measurements. For this purpose, the main components of the substrate layer and/or the substrate layer can be provided in film form with droplets of the individual components and/or the fluid, and the contact angle can be measured.

The at least one fluid comprises at least one first reactive component, which can be selected from a polymer, an oligomer, a monomer and any desired combinations thereof. The at least one first reactive component is capable of a reaction. This capacity to react can derive from the component itself or corresponding chemical groups or functional groups. As reactions, polymerization and/or crosslinking reactions can be used, such as e.g. a radical, an ionic, a condensation, or an addition reaction and any desired combinations thereof. The reaction is preferably radical polymerization and/or crosslinking. The first reactive component can be a low-molecular or thin oligomeric compound or any desired combinations thereof. In the case of oligomeric compounds, these can be linear, branched, star-shaped and/or dendritic structures that can be composed of one or a plurality of basic building blocks, which in turn can be in block form, alternating, or statistically arranged. The first reactive component generally has a molecular weight in the range of less than 1000 g/mol. Preferably, the molecular weight is less than 800 g/mol, particularly preferably less than 600 g/mol, and most particularly preferably less than 500 g/mol and can also be less than 300 g/mol. In cases where the second reactive component diffuses into the fluid, there is no upper limit on molecular weights.

An important property of the first reactive component is the diffusion rate in the substrate layer. On the one hand, it should be high in order to achieve a short exposure time, but on the other, it should not be so high that the swollen relief structure is not leveled because of excessively rapid diffusion before fixation can take place due to the action of heat or radiation.

The selection of the first reactive component also depends on its compatibility or solubility in the substrate layer. The highest possible compatibility and solubility is thereby advantageous.

Preferably, the at least one first reactive component comprises at least one reactive group selected from the group consisting of a C—C double bond, C—C triple bond, acryl group, methacryl group, vinyl ether group, vinyl ester group, thiol-vinyl ester group, vinyl carbonate group, —S—H group, —N—H$_n$(CH$_x$R$_y$)$_m$ (where n+m=2 and m≥1 and x+y=3 and x≥1) and any desired combinations thereof. Preferred are C—C double bonds, C—C triple bonds, acryl groups, methacryl groups, vinyl ether groups, particularly preferably acryl groups, methacryl groups, —S—H groups, and —N—H$_n$(CH$_x$R$_y$)$_m$ groups (where n+m=2 and m≥1 and x+y=3 and x≥1). The first reactive component should carry at least one of the above-mentioned reactive groups, but can also have 2 or more of the reactive groups, which is particularly advantageous in crosslinks and is preferably used in such cases.

Preferably, the first reactive component is contained in a concentration in the range of 5 to 100 wt. % based on the total fluid, preferably in the range of 10 to 100 wt. %, particularly preferably in the range of 20 to 99 wt. %, and most particularly preferably in the range of 50 to 99 wt. %.

Preferably, the first reactive component is at least one ethylenically unsaturated compound that contains at least one ethylenically unsaturated group. Suitable ethylenically unsaturated compounds are those that are compatible with the respectively selected polymeric binders. In general, these are compounds that are not gaseous at room temperature. Preferably, the ethylenically unsaturated compound comprises at least 2 ethylenically unsaturated groups, particularly preferably 2 to 6 ethylenically unsaturated groups, and most particularly preferably 2 ethylenically unsaturated groups. Compounds with C—C triple bonds can also be used in the radiation-sensitive mixture. Preferably, the ethylenically unsaturated group is at least one acrylate and/or methacrylate group, but acrylamides and vinyl ethers can also be used. The ethylenically unsaturated compound can be in the form of a monomer, oligomer or polymer and may be in linear, branched, star-shaped or dendritic form.

Preferred are in particular derivatives of acrylic and/or methacrylic acid, such as esters thereof with mono- or polyhydric alcohols, for example acrylic or methacrylic acid esters of alkanals with 1 to 20 carbon atoms, such as methyl methacrylate, ethyl acrylate, propyl (meth)acrylate, isopropyl (meth)acrylate, n-butyl (meth)acrylate, isobutyl (meth) acrylate, tert-butyl (meth)acrylate, hexyl (meth)acrylate, cyclohexyl (meth)acrylate, 2-ethylhexyl (meth)acrylate, lauryl (meth)acrylate, (meth)acrylic esters of polyhydric alcohols with 2 to carbon atoms, e.g. 2-hydroxyethyl (meth) acrylate, 2-hydroxypropyl (meth)acrylate, ethylene glycol di(meth)acrylate, polyethylene glycol di(meth)acrylate, butane diol-1,4-di(meth)acrylate, neopentyl glycol di(meth) acrylate, 3-methylpentanediol di(meth)acrylate, 1,1,1-trimethylolpropane tri(meth)acrylate, 1,4-butanediol diacrylate, 1,6-hexanediol diacrylate, 1,6-hexanediol dimethacrylate, 1,9-nonanediol diacrylate, di, tri- and tetraethylene glycol di(meth)acrylate, tripropylene glycol di(meth)acrylate or pentaerythritoltetra(meth)acrylate, furthermore poly(ethylene oxide) di(meth)acrylate, m-methylpoly(ethylene oxide)-yl-(meth)acrylate, N,N-diethylaminoethyl acrylate, a reaction product of 1 mol glycerol, 1 mol epichlorohydrin and 3 mol acrylic acid and glycidyl methacrylate and bisphenol-A-diglycidyl ether acrylate.

Also suitable are derivatives of acrylamide and of methacrylamide, such as e.g. ethers of their N-methylol derivatives with mono- and polyhydric alcohols, e.g. ethylene glycol, glycerol, 1,1,1-trimethylolpropane, oligomeric or polymeric ethylene oxide derivatives. These are particularly suitable when polyamides or polyvinyl alcohol is/are used as binders.

Suitable are also so-called epoxide and urethane (meth) acrylates, such as can be obtained for example by reacting bisphenol-A-diglycidyl ether with (meth)acrylic acid or by reacting diisocyanates with hydroxyalkyl (meth)acrylates or with hydroxyl-group-containing polyesters or polyethers. Moreover, suitable olefinically unsaturated compounds are esters of acrylic or methacrylic acid, in particular those with low vapor pressure and those modified with compatibilizers, e.g. with hydroxy, amido, sulfoester, or sulfonamide groups.

Mixtures of the above-mentioned copolymerizable ethylenically unsaturated organic compounds can also be used.

Examples of components with an —S—H group are linear, branched, cyclical or dendritic thiols, aromatic thiols and any desired combinations thereof. Preferably, the less volatile thiols are used. Examples of such thiols are pentaerythritol tetra(3-mercaptopropionate), pentaerythritol tetramercaptoacetate, and ethoxylated trimethylolpropane-tri(3-mercaptopropionate), which also can be used in any desired combinations.

Examples of components with an —N—H$_n$(CH$_x$R$_y$)$_m$ group, wherein n+m=2 and m≥1 and x+y=3 and x≥1, include diethanolamine, triethanolamine, diethylaminoethanol, N-methyldiethanolamine, mono, di- and triisopropanolamine, morpholine and derivatives, which can also be used in any desired combinations.

Preferably, the at least one fluid comprises further components selected from the group consisting of at least one initiator, a catalyst, an initiator system, a stabilizer, a dye, a pigment, an additive, a UV absorber, a plasticizer and any desired combinations thereof. The further components in the fluid may be identical to the respective components described in connection with the substrate layer if they do not excessively increase the viscosity of the fluid. Examples of these have already been described above. The concentration of the further components of the fluid is in the range of 0 to 50 wt. % based on the total fluid, preferably in the range of 0 to 50 wt. %, particularly preferably in the range of 1 to 20 wt. %, and most particularly preferably in the range of 1 to 5 wt. %. The concentration of an individual further component can vary from 0 wt. % to 10 wt. %.

In order to prevent a reaction of the fluid prior to application to the surface of the substrate, it is preferable for the fluid not to contain any combination of a polymerizable or crosslinkable first reactive component and an initiator or catalyst. Fluids free of initiators are particularly preferred.

Preferably, the fluid comprises as a first reactive component catalysts, initiators or initiator systems of at least two components, which on irradiation with electromagnetic waves produce radicals that cause polymerization and/or crosslinking. Such catalysts, initiators and initiator systems are known to the person skilled in the art (see above under second reactive component).

Preferably, the fluid comprises the catalyst, initiator or the initiator system in a concentration in the range of 0.1 wt. % to 99.9 wt. % based on the total weight of the fluid. Preferred concentrations are in the range of 1 to 99 wt. %, particularly preferably in the range of 1 wt. % to 80 wt. %, and most particularly preferably in the range of 2 wt. % to 60 wt. %.

If the fluid contains only catalysts, initiators, and/or initiator systems as reactive components, it is preferable for the substrate layer to contain components that are cross-linked or modified in their solubility by the catalysts, initiators and/or initiator systems.

A further aspect of the invention relates to a relief structure obtained according to one of the methods described.

An additional aspect of the invention relates to the use of such a relief structure as a printing form. The printing form can be used in various printing methods, such as e.g. letterpress printing, gravure printing, flexographic printing, offset printing, pad printing, microembossing and any desired combinations thereof. Further possible applications of the produced relief structure are: optical components (e.g. Fresnel lenses), diffractive optical components (e.g. optical grids), components having a lotus leaf structure and/or lotus leaf effect, templates for directed growth of biological structures (e.g. cells, woven fabrics), membranes in separation processes, separating materials, membranes for accumulators and/or batteries, or structured isolators for electronic components.

When at least one further layer is applied to the produced relief structures that is configured such that it does not follow the form of the relief, components are produced with channels and/or cavities that can be separate from or connected to one another. For this purpose, the further layer can be stiff or inflexible so that it does not sink into the depressions, but flexible layers can also be used, provided that one takes suitable measures to ensure that the further layer cannot sink into the depressions. This can for example be achieved by filling the depressions with fluids and/or gases. After application of the further layer, the fluids and/or gases can be removed. The channels and/or cavities produced in this manner can optionally be provided with other materials and/or fluids. Such components can be used as a microfluidic component (e.g. for microanalysis and/or for high-throughput screening), as a microreactor, as a phoretic cell (such as e.g. disclosed in WO2004/015491), as a light-controlling element for color representation (such as e.g. described in WO2003/062900) or as photonic crystals. The further layer can for example be applied in the aftertreatment according to step g).

The above-mentioned components can be rigid and/or flexible. Flexible embodiments are particularly preferred for when they are to be worn on and/or carried within the body and/or used in tissues and/or articles of clothing.

EXAMPLES

Example 1

For contact angle measurement, plates comprising a polymeric binder, a plasticizer, and a photoinitiator were extruded, and 1 µl droplets of fluids (acrylic compounds) were deposited thereon using a pipette. In each case, the contact angle was determined immediately after deposition of the droplets.

The plate-shaped materials were produced as follows: a mixture (see Table 1a for the composition of the individual plates and Table 1b for the chemical properties of the components) containing a polymeric binder, a plasticizer oil and 5 parts of benzyl dimethyl ketal as a photoinitiator was melted in an extruder at elevated temperatures (120° C. to 180° C.) and calendered via a wide slit nozzle between two PET films with a thickness of 125 µm so that the substrate layer (photopolymer+carrier film) had a thickness of 1450 µm. The lower PET film is used as a carrier film and the upper PET film as a protective layer.

After removal of the upper PET film, using a pipette ("Dispenser" from VWR with pipette tips of corresponding volume), droplets of a fluid were deposited with a volume of 1 µl on the surfaces of plates 1 and 5. Using a microscope (Digital Microscope VHX-500F from Keyence), the contact angle was measured immediately after application. Moreover, the viscosity of the different monomers was also measured (see Tab. 1c).

Viscosity was measured using an MC 120 rotational rheometer (from Physica) with a cone and plate geometry at 20° C., wherein the cone had a diameter of 50 mm and an angle of 1°. Measurement was effected at a rotation speed of 120 rpm for a period of 2 minutes at a shear rate of 720 s$^{-1}$ and the software UC 200/32 (V 2.50) was used.

For contact angle measurement, a microscope (Digital Microscope VHX 500F with objective VH-Z250R from Keyence) was tilted by 90° so that the droplets could be examined and measured from the side. The contact angle is the angle between the substrate surface and the tangents on the droplet surface at the point of contact. As fluids, ethylhexyl acrylate (EHA), hexanediol diacrylate (HDDA), hexanediol dimethacrylate (HDMA), pentaerythritol triacrylate (PETA), and 2-hydroxyethyl acrylate (HEA) were tested. In addition, a mixture of HDDA and HDMA with a mixing ratio of 1:1 was tested.

TABLE 1a

| | | Compositions | | | |
|---|---|---|---|---|---|
| | Binder | White oil | Polybutadiene oil | Hexamoll DINCH | Benzyl dimethyl ketal |
| Plate 1 | Binder 1 | 10% | | | 5% |
| Plate 2 | Binder 2 | | 20% | | 5% |
| Plate 2 | Binder 3 | 20% | | | 5% |
| Plate 4 | Binder 4 | | | 20% | 5% |
| Plate 5 | Binder 5 | 10% | | | 5% |
| Plate 6 | Binder 4 | | | 20% | 10% |

TABLE 1b

| | Chemical properties of the binders and plasticizers | | | |
|---|---|---|---|---|
| Binders/oils | Chemical nature | Styrene/ethylene/ vinyl content/$M_n$ | Hardness | Kinematic viscosity (DIN 51562) |
| Binder 1 | SIS rubber | 14% styrene | 42° Shore A | |
| Binder 2 | SBS rubber | 25% styrene | 61° Shore A | |
| Binder 3 | EPDM rubber | 70% ethylene | no data | |
| Binder 4 | SBS rubber | 60% styrene | 84° Shore A | |
| Binder 5 | SIS rubber | 15% styrene | 32° Shore A | |
| Polybutadiene oil | High-vinyl polybutadiene oil | >85% vinyl $M_n$ = 1100 g/mol | | |
| White oil | Highly refined mineral oil | $M_n$ = 300 g/mol | | 70 mm$^2$/s (40° C.) |

TABLE 1c

Variation in droplet surface tension

| | Fluid | | | | | |
|---|---|---|---|---|---|---|
| | EHA | HDDA | HDMA | PETA | HEA | HDDA/HDMA 1/1 |
| Contact angle on plate 1 | 26.1° | 16.5° | 27.4° | 48.1 | | |
| Contact angle on plate 5 | 12.6° | 25.0° | 25.5° | 40.0° | 39.46° | 22.41 |
| Viscosity (mPa · s) | 0.4 | 5.3 | 4.2 | 1127 | | |

TABLE 1d

Variation in substrate layer surface tension

| Substrate | Plate 1 | Plate 2 | Plate 3 | Plate 4 | Plate 5 |
|---|---|---|---|---|---|
| Contact angle with HDDA | 16.5 | 20.8 | 22.1 | 38.5 | 25.0° |

Tables 1c and 1d show that by selecting the fluid and/or the substrate layer, the contact angle can be varied over a wide range. It is also clear that fluids with sharply differing viscosity can be used.

Example 2

Production of plate-shaped materials: For example 2a, a mixture containing 65 parts of an SBS (styrene-butadiene-styrene) copolymer (SBS triblock, with a styrene content of 24% and a molecular weight Mw of 130,000 g/mol) as a binder, 10 parts of hexanediol diacrylate (HDDA), 20 parts of a 1:1 mixture of a low-vinyl polybutadiene oil (vinyl <2%, Mn=5000 g/mol) and a high-vinyl polybutadiene oil (vinyl >85%, Mn=1100 g/mol), 2 parts of benzyl dimethyl ketal as a photoinitiator, and as further components, 2 parts of 3,5-di-tert-butyl-4-hydroxytoluene and 1 part dye (Orasol Blue), was melted in an extruder at elevated temperatures (120° C. to 180° C.) and calendered via a wide slit nozzle between two PET films with a thickness of 125 µm, so that the substrate layer (photopolymer+carrier film) had a thickness of 1450 µm. In example 2b, 2 wt. % of a paraffin wax (setting point 58° C. to 60° C., density 0.91 g/cm$^2$) was additionally used.

After removal of the upper PET film, using a pipette ("Dispenser" from VWR with pipette tips of corresponding volume), droplets of the fluid F1, composed of hexane diol diacrylate (Laromer HDDA BASF), were deposited with a volume of 1 µl on the plate surfaces. Using a microscope (Digital Microscope VHX-500F from Keyence), the droplet diameter ($Ø_0$) was measured immediately after application. After 20 minutes, during which the HDDA had time to diffuse in, the diameter ($Ø_{20}$) was again measured. After this, the supernatant fluid was removed by rinsing with a mixture of 1-propanol/water (4:1), and the surface was exposed for 10 min to UVA (Flint Group, Fill exposure unit main exposure) and then for 5 min to UVC (Flint Group, Fill light finishing drawer). The resulting reliefs were measured with a Perthometer, and the height of the elevation H and the diameter at half height ($Ø_R$) were determined. The tests were carried out 5 times each, and the measured values given represent the arithmetic mean.

The Perthometer measurements were carried out with a MarSurf M 300 mobile roughness meter from Mahr using the software "MarWin XR20" (V 4.26). A scanning rate of 0.5 mm/s and a measurement force of 0.00075 N were used.

TABLE 2

Values standardized to example 2a

| | Wax (%) | Contact angle | $Ø_0$ | $Ø_{20}$ | $Ø_R$ | H |
|---|---|---|---|---|---|---|
| Example 2a | 0 | 1 | 1 | 1 | 1 | 1 |
| Example 2b | 2 | 1.3 | 0.89 | 0.89 | 0.89 | 1 |

Table 2 shows that relief structures can be obtained in this manner and that because wax is used, a higher contact angle is produced, the fluid droplets spread out less, and structures can be produced with more precise detail. Moreover, it was found that with use of wax, the relief structures were stable after shorter exposure times.

Example 3

Production of plate-shaped materials: For example 3a, a mixture containing 85 parts of an SIS (styrene-isoprene-styrene) copolymer (Mw=240,000 g/mol, styrene content 14.3%, 25% diblock), 10 parts of a medicinal white oil (Mn=300 g/mol), and 5 parts of benzyl dimethyl ketal was melted in an extruder at elevated temperatures (120° C. to 180° C.) and calendered via a wide slit nozzle between two PET films with a thickness of 125 µm, so that the layer construction had a thickness of 1450 µm. In examples 3b and 3c, 2 or 4 wt. % of a paraffin wax (setting point 58° C. to 60° C., density 0.91 g/cm$^2$) was additionally used.

After carrying out the same method as in example 2, the surfaces were provided with fluid F1. After diffusion, the surfaces were exposed for a duration of 20 minutes. The results are shown in Table 3.

TABLE 3

Values standardized to example 3a

| | Wax (%) | Contact angle | $Ø_0$ | $Ø_{20}$ | $Ø_R$ | H |
|---|---|---|---|---|---|---|
| Example 3a | 0 | 1 | 1 | 1 | 1 | 1 |
| Example 3b | 2 | 1.61 | 0.85 | 0.83 | 0.8 | 1.125 |
| Example 3c | 4 | 1.64 | 0.92 | 0.88 | 0.8 | 1.04 |

Table 3 shows that relief structures can be obtained in this manner and that because wax is used, a higher contact angle is produced, the fluid droplets spread out less, and structures can therefore be produced with greater height and more precise detail.

Example 4

In example 4, the plate-shaped materials of examples 2a and 3a to 3c were used and treated as follows.

Using the pipette, droplets of fluid F1 were placed on the substrate layer with a volume of 1 µl. After a waiting period of 20 minutes, the portion of the fluid F1 that had not diffused in was removed with a solvent mixture of 1-propanol/water (4:1) from the surface and a second droplet of the fluid F1 was applied with a volume of 0.5 µl to the already formed relief structure at the location of the first droplet. Using the microscope, the droplet diameter ($Ø_0$) was measured immediately after application of the second droplet. After 20 minutes, during which the monomer had time to diffuse in, the diameter ($\varnothing_{20}$) was again measured. After this, supernatant fluid was removed by rinsing with a mixture of 1-propanol/water (4:1), and the surface was exposed under the same conditions as in example 1. The resulting reliefs were measured with the Perthometer, and the height of the elevation H and the diameter at half height ($\varnothing R$) were determined. The tests were carried out 5 times each, and the measured values given represent the arithmetic mean.

TABLE 4

Values standardized to example 2a

| | Wax (%) | $\varnothing_0$ | $\varnothing_{20}$ | $\varnothing_R$ | H |
| --- | --- | --- | --- | --- | --- |
| Example 2a | 0 | 1 | 1 | 1 | 1 |
| Example 3a | 0 | 1.28 | 1.27 | 0.96 | 1.29 |
| Example 3b | 2 | 0.93 | 0.9 | 0.85 | 1.88 |
| Example 3c | 4 | 0.96 | 0.95 | 0.83 | 2.29 |

Table 4 shows that the height of the relief structures can be increased by application of further droplets and that because wax is used, the fluid droplets do not spread, allowing structures to be produced that have more precise detail and are higher.

Example 5

Example 2 was repeated, but using the fluid F2, composed of 98 wt. % hexanediol diacrylate and 2 wt. % benzyl dimethyl ketal. It was found that the similarly dimensioned reliefs were already stable after significantly shorter exposure times (reduced by at least half).

Example 6

Example 2 was repeated, but using the fluid F3, composed of 95 wt. % hexanediol diacrylate and 2 wt. % triethanolamine. It was found that the similarly dimensioned reliefs were already stable after approximately 20% shorter exposure times.

Example 7

Example 2 was repeated, but using the fluid F4, composed of 99.5 wt. % hexanediol diacrylate and 0.5 wt. % butylhydroxytoluene. It was found that the formulation F4 was significantly more stable and the pipette tips became blocked to a lesser extent and approximately 5 to 10 times more slowly.

Example 8

Example 1 was repeated, but using the fluid F5, composed of 95 wt. % hexanediol diacrylate and 5 wt. % azoisobutyronitrile. In this case, before fixing according to step f), a 0.5 µm thick PET film was laminated onto the surface as a barrier layer. After this, the sample was treated for 1 h at 150° C. in an oven (FDL 115 from Binder GmbH). Relief structures were obtained the heights of which could be increased by wiping off with a cloth saturated in a mixture of 33 wt. % cyclohexanol, 47 wt. % of a hydrocarbon mixture (CAS: 64742-47-8 and 64742-48-9) with a low aromatic content and 20 wt. % diisopropylbenzene. Both with and without this wiping off, the stability of the relief structures could be sharply increased by subsequent exposure (10 min to UVA (Flint Group, Fill exposure unit main exposure) and then 5 min to UVC (Flint Group, Fill light finishing drawer).

Example 9

Example 1 was repeated, but a PET film was laminated onto the surface prior to exposure. It was found that the similarly dimensioned reliefs were already stable after significantly shorter exposure times.

Example 10

Production of plate-shaped materials: A mixture containing 85 parts of an SIS copolymer (Mw=240,000 g/mol, styrene content 14.3%, 25% diblock), 10 parts of a medicinal white oil (Mn=300 g/mol), and 5 parts of benzyl dimethyl ketal was melted at elevated temperatures (120-180° C.) in an extruder and calendered via a wide slit nozzle between two PET films with a thickness of 125 µm, so that the layer construction had a thickness of 1450 µm.

After removal of the upper PET film, using a pipette ("Dispenser" from VWR with pipette tips of corresponding volume), droplets of the fluid F1, composed of hexanediol diacrylate (Laromer HDDA BASF), were deposited with a volume of 1 µl on the plate surfaces.

After this, the supernatant fluid was removed by rinsing with a mixture of 1-propanol/water (4:1), and the surface was exposed for 10 min to UVA (Flint Group, Fill exposure unit main exposure) and then for 5 min to UVC (Flint Group, Fill light finishing drawer). After this, the surfaces were heated by means of an IR emitter so that the non-swollen and crosslinked areas became viscous. The heated surface was brought into contact one or several times with a polyester web, and softened areas were removed when the web was peeled off. After cooling, the relief heights were found by measurement to be elevated by up to 100%.

Example 11

Example 2a was repeated, but after peeling off the upper PET film, an imageable mask layer was applied. For this purpose, a coating solution of 70 wt. % polyvinyl alcohol (degree of saponification of approx. 72 mol %, viscosity of a 4 wt. % solution in water approx. 6 mPa·s), 29.8% Levanyl Black A-SF, and 0.02% Zonyl FSN in a solvent mixture (water/n-propanol 3:1) with a solid content of 5% was produced. The coating solution was blade-coated onto a 100 µm thick Mylar film and dried. The produced mask layer had a dry layer thickness of 3 µm. The Mylar film coated with the laser-ablatable mask layer was laminated onto the substrate layer at a laminating temperature of 120° C. After cooling of the composite, the Mylar film was peeled off, with the laser-ablatable mask layer remaining on the substrate layer.

The layer construction of carrier film, substrate layer and laser-ablatable mask layer was fixed onto the drum of an IR laser (Thermoflex 20, Xeikon) and imaged with a power of 30 W at a resolution of 5080 dpi. Dots with a diameter of 20 µm, 40 µm, 60 µm, and 80 µm were written in as pictorial information. Individual droplets of the fluid F2 were applied to the openings, after a waiting period of 10 minutes, rinsing was carried out with a water/n-propanol 3:1 solution until the mask layer was completely washed off, and the surface was exposed for 10 min to UVA (Flint Group, Fill exposure unit main exposure) and then for 5 min to UVC (Flint Group, Fill light finishing drawer). Relief structures were obtained having a relief height slightly lower than when no mask layer was applied. In further tests, the openings of the mask layer were provided with fluid F2, with the same layer construction and the same exposure conditions, but they were first exposed, after which the mask layer was removed by rinsing with the water/isopropanol mixture. After this, drying was carried out for 20 minutes at 50° C. Relief structures were obtained with a relief height of up to 50% greater than without the mask layer.

Example 12

Using a plate produced according to example 1 and a reference plate without a photoinitiator, after removal of the upper PET film, droplets were deposited in each case with a pipette in a volume of 10 µl pentaerythritol tetraacrylate (PETA Sigma-Aldrich) on the plate surfaces and left there for 1 h. After this, exposure was carried out for 15 minutes (Flint Group, Fill exposure unit main exposure). Non-polymerized PETA was removed with a cloth, and the height of the resulting relief was measured at 650 µm. For the reference plate without the photoinitiator, all of the PETA was removed, and no swelling of the plate was observed. This means that diffusion of a reactive component (the photoinitiator) from the substrate layer into the PETA droplets had occurred, and this component had been at least partially fixed by the subsequent exposure.

Example 13

Production of plate-shaped materials: A mixture containing 65 parts of an SBS copolymer (SBS triblock, with a styrene content of 24% and a molecular weight Mw of 130,000 g/mol) as a binder, 10 parts of hexanediol diacrylate, 20 parts of a 1:1 mixture of a low-vinyl polybutadiene oil (vinyl >2%, Mn=5000 g/mol) and a high-vinyl polybutadiene oil (vinyl >85%, Mn=1100 g/mol), 2 parts of benzyl dimethyl ketal as a photoinitiator, and as further components, 2 parts of 3,5-di-tert-butyl-4-hydroxytoluene and 1 part dye (Orasol Blue), was melted in an extruder at elevated temperatures (120° C. to 180° C.) and calendered via a wide slit nozzle between two PET films with a thickness of 125 µm, so that the substrate layer (photopolymer+carrier film) had a thickness of 1450 µm. As in example 2b, 2 wt. % of a paraffin wax was additionally used (setting point 58-60° C., density 0.91 g/cm).

Using an Omni Jet 100 (Unijet), droplets of hexanediol diacrylate were applied with a volume of 6-7 µl per droplet to these plates. Four rows of 10 fields each consisting of 25×25 individual droplets were applied. Printing of one row took one minute, and the first row was fixed by exposure after an exposure time of 1 minute, the second row after 4 minutes, the third row after 7 minutes, and the fourth row after 10 minutes. Exposure was carried out using a Rapid 3000 Lamp (Welisch Elektronik GmbH) with a power of 3 mW/cm² at a distance of 75 mm for 12 minutes. As a result, 40 relief structures were obtained with an areal extent of approx. 1 mm×1 mm whose height varied depending on the exposure time. For illustrative purposes, the heights of the first fields of a row are indicated as measured using a Perthometer.

It can be seen from FIG. 1 that with increasing exposure time t, the height h of the relief structure produced increases approximately linearly.

Example 14

As was described with respect to example 13, droplets were applied to a plate, but a row of 30 fields of 50×50 droplets was first printed on, and after a waiting period of 730 seconds, a second layer of fields composed of 25×25 droplets was applied to the center of the fields produced. This structure was then exposed as in example 13 for 3 minutes.

After fixing, the first layer had an edge length of approx. 1 mm and a height of 20 µm to 24 µm. The second layer had an edge length of approx. 800 µm and a height of 3 µm to 7 µm.

Example 15

The tests of example 14 were repeated, but exposure was carried out for 3 minutes after application of the first layer with an exposure time of 3 minutes (same conditions as in example 13). After this, the second layer of 25×25 droplets was applied to the existing fields and again exposed for 3 minutes after a further exposure time of 3 minutes.

After the wide area fixation, the first layer had an edge length of approx. 1 mm and a height of 18 µm to 25 µm. The second layer had an edge length of approx. 800 µm and a height of 2 µm to 8 µm.

The invention claimed is:

1. A method for generatively producing pictorial relief structures on a layer construction comprising the following steps:
   a) providing a layer construction having a substrate layer,
   b) optionally, partial removing a mask layer, so that the at least one substrate layer is pictorially exposed,
   c) pictorial application of at least one fluid containing at least one first reactive component to the substrate layer, wherein the pictorial application takes place in the form of a plurality of droplets with a droplet volume of less than 2 µl, and wherein the droplets are positioned pictorially,
   d) at least partial diffusing of the at least one first reactive component into the substrate layer for a predefined exposure time and/or at least partial diffusing of at least one second reactive component into the pictorially positioned droplets of fluid for a predefined exposure time, wherein the substrate layer comprises the at least one second reactive component, wherein the predefined exposure time is at least one second and wherein the first reactive component has a molecular weight in the range of less than 1000 g/mol, wherein by means of the diffusion of the fluid or components thereof, the volume of the substrate layer in the treated area increases, giving rise to an elevated area, a relief structure,
   e) optionally, removing fluid remaining on the substrate layer,
   f) fixing of the created relief under the influence of heat and/or radiation via a reaction involving the first reactive component and/or the second reactive component, and
   g) optional aftertreatment of the relief.

2. The method as claimed in claim 1, wherein the at least one first reactive component and/or the second reactive component is selected from the group consisting of a polymer, an oligomer, a monomer, a low-molecular compound, a catalyst, an initiator and combinations of at least two of these components.

3. The method as claimed in claim 2, wherein the at least one first reactive component and/or the second reactive component contains at least one reactive group selected from the group consisting of a C—C double bond, C—C triple bond, acryl group, methacryl group, vinyl ether group, vinyl ester group, thiol-vinyl ester group, vinyl carbonate group, —S—H group, —N—H$_n$(CH$_x$R$_y$)$_m$ (where n+m=2 and m≥1 and x+y=3 and x≥1) and combinations of at least two of these reactive groups.

4. The method as claimed in claim 2, wherein the at least one catalyst or the at least one initiator is thermally and/or photochemically activatable.

5. The method as claimed in claim 1, wherein the substrate layer comprises a wax.

6. The method as claimed in claim 1, wherein the viscosity of the fluid is in the range of 0.1 to 10 mPa·s based on a temperature of 20° C.

7. The method as claimed in claim 1, wherein the droplet-wise application of the fluid takes place using at least one nozzle that is movable relative to the substrate layer.

8. The method as claimed in claim 1, the contact angle of the fluid on the substrate layer is in the range of 5° to 110°.

9. The method as claimed in claim 1, wherein the removal of fluid remaining on the surface of the substrate according to step e) is carried out by a method selected from the group consisting of suctioning off, blowing off, scraping off, shaking off, washing off and combinations of at least two of these methods.

10. The method as claimed in claim 1, wherein the fixing according to step f) takes place in an inert gas atmosphere, or in that before beginning the fixing according to step f), a barrier layer is applied to the layer construction.

11. The method as claimed in claim 1, wherein the exposure time in step d) is 10 seconds to 30 minutes.

12. The method as claimed in claim 1, wherein the exposure time in step d) is 1 minute to 5 minutes.

13. The method as claimed in claim 1, wherein step b) partial removing a mask layer, so that the at least one substrate layer is pictorially exposed, is required.

14. The method as claimed in claim 1, wherein the relief structure has a height after a single application of a fluid is in the range of 0.01 μm to 50 μm and/or wherein after multiple applications of fluid, the relief height is in the range of 0.05 μm to 1000 μm.

15. The method as claimed in claim 1, wherein the relief structure has a height after a single application of a fluid is in the range of 1 μm to 10 μm and/or wherein after multiple applications of fluid, the relief height is in the range of 1 μm to 10 μm.

16. The method as claimed in claim 1, wherein the substrate layer comprises surfactant substances selected from: surfactants, amphiphilic molecules with hydrophobic and hydrophilic areas, and block copolymers and oligomers containing blocks having a lower surface energy in order to exert an action as a mobile blocking layer for oxygen and/or prevent excessive spreading of the applied fluid droplets.

17. The method as claimed in claim 1, wherein the substrate layer comprises at least one elastomeric binder which is a hydrophobic binder which is not or at least not substantially swellable in water.

18. The method as claimed in claim 17, wherein the elastomeric binder is an elastomeric block copolymer of alkenyl aromatics and 1,3-dienes having at least one styrene-isoprene block copolymer or styrene-butadiene block copolymer.

19. A method for producing pictorial relief structures on a layer construction comprising the following steps:
   a) providing a layer construction having a substrate layer,
   b) optionally, partial removing a mask layer, so that the at least one substrate layer is pictorially exposed,
   c) pictorial application of at least one fluid containing at least one first reactive component to the substrate layer, wherein the pictorial application takes place in the form of a plurality of droplets with a droplet volume of less than 2 μl, and wherein the droplets are positioned pictorially,
   d) at least partial diffusing of the at least one first reactive component into the substrate layer for a predefined exposure time and/or at least partial diffusing of at least one second reactive component into the pictorially positioned droplets of fluid for a predefined exposure time, wherein the substrate layer comprises the at least one second reactive component, wherein the predefined exposure time is at least one second,
   e) optionally, removing fluid remaining on the substrate layer,
   f) fixing of the created relief under the influence of heat and/or radiation via a reaction involving the first reactive component and/or the second reactive component, and
   g) aftertreatment of the relief, wherein the aftertreatment comprises application of a further layer to the produced relief structures, wherein the further layer is configured such that it does not follow the shape of the relief, so that cavities and/or channels are produced between the substrate layer and the further layer.

20. A method for generatively producing pictorial relief structures on a layer construction comprising the following steps:
   a) providing a layer construction having a substrate layer,
   b) optionally, partial removing a mask layer, so that the at least one substrate layer is pictorially exposed,
   c) pictorial application of at least one fluid containing at least one first reactive component to the substrate layer, wherein the pictorial application takes place in the form of a plurality of droplets with a droplet volume of less than 2 μl, and wherein the droplets are positioned pictorially,
   d) at least partial diffusing of the at least one first reactive component into the substrate layer for a predefined exposure time and/or at least partial diffusing of at least one second reactive component into the pictorially positioned droplets of fluid for a predefined exposure time, wherein the substrate layer comprises the at least one second reactive component, wherein the predefined exposure time is at least one second, wherein by means of the diffusion of the fluid or components thereof, the volume of the substrate layer in the treated area increases, giving rise to an elevated area, a relief structure;
   e) optionally, removing fluid remaining on the substrate layer,
   f) fixing of the created relief under the influence of heat and/or radiation via a reaction involving the first reactive component and/or the second reactive component.

* * * * *